US010600669B2

(12) United States Patent
Shiraiwa

(10) Patent No.: US 10,600,669 B2
(45) Date of Patent: Mar. 24, 2020

(54) SUBSTRATE FIXTURE AND SUBSTRATE FIXING DEVICE

(71) Applicant: SHINKO ELECTRIC INDUSTRIES CO., LTD., Nagano-shi, Nagano (JP)

(72) Inventor: Norio Shiraiwa, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 239 days.

(21) Appl. No.: 15/902,241

(22) Filed: Feb. 22, 2018

(65) Prior Publication Data

US 2018/0247852 A1  Aug. 30, 2018

(30) Foreign Application Priority Data

Feb. 27, 2017 (JP) ................. 2017-035169

(51) Int. Cl.
*H01L 21/683* (2006.01)
*H01L 21/67* (2006.01)
*H01J 37/32* (2006.01)
*H01L 21/687* (2006.01)

(52) U.S. Cl.
CPC .... *H01L 21/6833* (2013.01); *H01J 37/32724* (2013.01); *H01L 21/67069* (2013.01); *H01L 21/67103* (2013.01); *H01L 21/67109* (2013.01); *H01L 21/6831* (2013.01); *H01L 21/68742* (2013.01); *H01L 21/68757* (2013.01); *H01L 21/68771* (2013.01); *H01J 37/3244* (2013.01); *H01J 2237/2001* (2013.01); *H01J 2237/2007* (2013.01); *H01J 2237/334* (2013.01)

(58) Field of Classification Search
CPC ........... H01L 21/6833; H01L 21/68757; H01L 21/6831; H01L 21/68771; H01L 21/68742; H01L 21/67109; H01L 21/67103; H01L 21/67069; H01J 37/32724; H01J 37/3244; H01J 2237/2001; H01J 2237/334; H01J 2237/2007
USPC .......................................... 361/234
See application file for complete search history.

(56) References Cited

U.S. PATENT DOCUMENTS

2013/0048217 A1* 2/2013 Shiraiwa ........... H01L 21/67109
                                                            156/345.53
2014/0334059 A1* 11/2014 Miyazawa ........ H01L 21/68757
                                                            361/234
2015/0371885 A1  12/2015 Tamagawa et al.

FOREIGN PATENT DOCUMENTS

JP     2013-045989     3/2013
JP     2013-161839     8/2013
JP     2013-187477     9/2013
JP     2013-201432    10/2013
JP     2016-009715     1/2016

OTHER PUBLICATIONS

JP-2013-45989; Specification, Drawings, abstract (Year: 2013).*

* cited by examiner

*Primary Examiner* — Dharti H Patel
(74) *Attorney, Agent, or Firm* — Rankin, Hill & Clark LLP

(57) ABSTRACT

A substrate fixture includes a monopolar chuck main body comprising an insulated plate and an electrode embedded in the insulated plate, a tray placed on the chuck main body, having an upper surface in which a plurality of concave parts for accommodating therein a plurality of substrates is formed, and formed of an insulator having a volume resistivity equal to or lower than a volume resistivity of the insulated plate, and an yttrium oxide layer formed on the upper surface of the tray.

6 Claims, 22 Drawing Sheets

FIG. 20
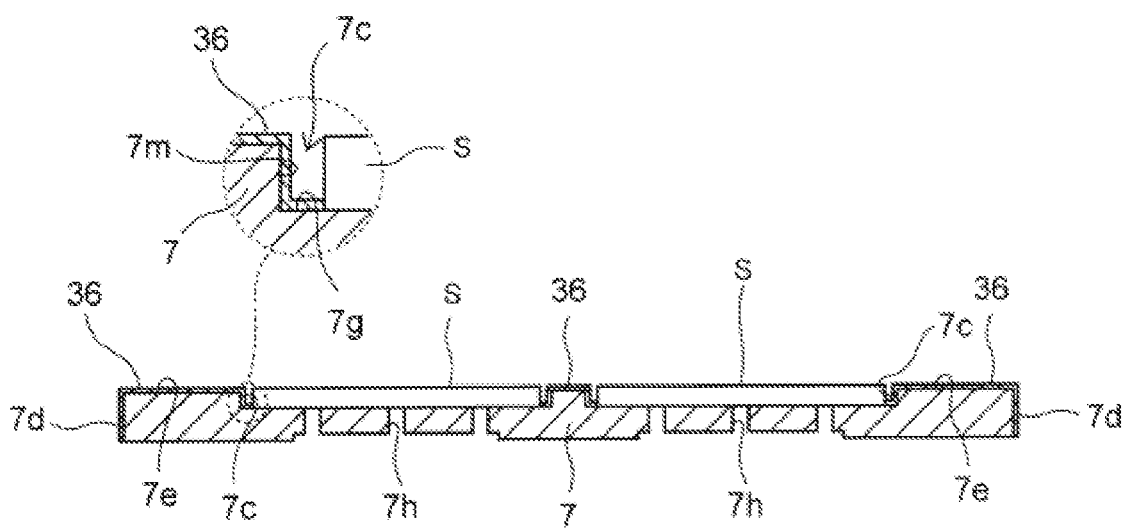
FIG. 21
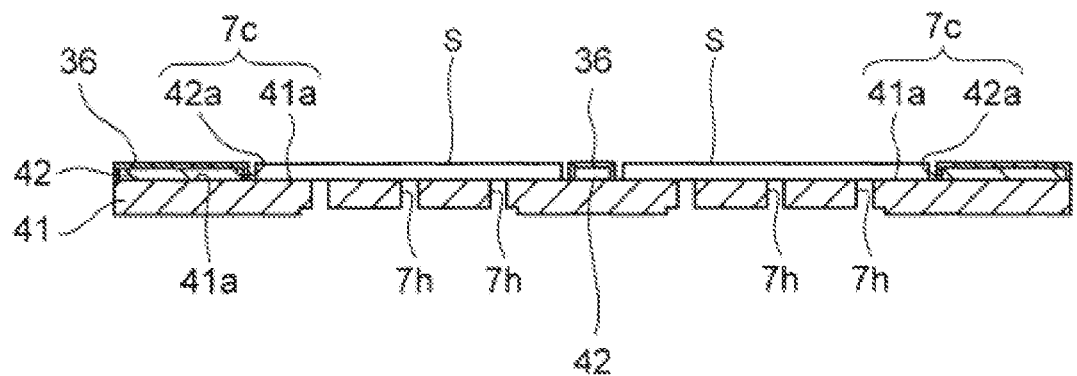

SUBSTRATE FIXTURE AND SUBSTRATE FIXING DEVICE

CROSS-REFERENCE TO RELATED APPLICATION

The present application claims priority from Japanese Patent Application No. 2017-035169 filed on Feb. 27, 2017, the entire content of which is incorporated herein by reference.

BACKGROUND

Technical Field

The invention relates to a substrate fixture and a substrate fixing device.

Related Art

A semiconductor device such as an LED (Light Emitting Diode) is manufactured by performing a variety of processes such as dry etching, CVD (Chemical Vapor Deposition) and the like for an insulated substrate or a semiconductor substrate. In these processes, a plurality of substrates is processed at the same time while using a substrate fixing device for fixing the plurality of substrates in a chamber.

As an example of the substrate fixing device, a substrate fixing device using an electrostatic chuck has been known. The electrostatic chuck has functions of fixing a substrate by an electrostatic force and cooling the substrate. By the cooling, an etching rate and a film forming rate become uniform in a substrate surface, so that it is possible to suppress variation in electrical characteristics of each semiconductor device to be cut from one substrate.

Patent Document 1: JP-A-2013-45989
Patent Document 2: JP-A-2016-9715
Patent Document 3: JP-A-2013-201432
Patent Document 4: JP-A-2013-187477
Patent Document 5: JP-A-2013-161839

However, the substrate fixture using the electrostatic chuck has room for improvement, from a standpoint of suppressing the manufacturing cost.

SUMMARY

Exemplary embodiments of the present invention provide a substrate fixture and a substrate fixing device which can suppress the manufacturing costs.

A substrate fixture according to an exemplary embodiment of the invention comprises:
a monopolar chuck main body comprising an insulated plate and an electrode embedded in the insulated plate;
a tray placed on the chuck main body, having an upper surface in which a plurality of concave parts for accommodating therein a plurality of substrates is formed, and formed of an insulator having a volume resistivity equal to or lower than a volume resistivity of the insulated plate; and
an yttrium oxide layer formed on the upper surface of the tray.

According to one aspect, since the substrate is accommodated in the concave part of the tray, it is not necessary to re-prepare the insulated plate even when a shape and a size of the substrate are changed, so that it is possible to suppress the manufacturing cost of the substrate fixture.

Also, since the volume resistivity of the tray is equal to or lower than the volume resistivity of the insulated plate, it is possible to increase the adsorption force of the substrate to the tray.

Also, the yttrium oxide layer is formed on the upper surface of the tray, so that it is possible to protect the tray from the plasma atmosphere and to thereby prolong the lifespan of the tray.

BRIEF DESCRIPTION OF THE DRAWINGS

FIG. 20 is a sectional view of a tray in accordance with a second exemplary embodiment.

FIG. 21 is a sectional view of a tray in accordance with a third exemplary embodiment.

DETAILED DESCRIPTION

Before describing exemplary embodiments, the investigation contents of the inventor are described.

Figure 1:
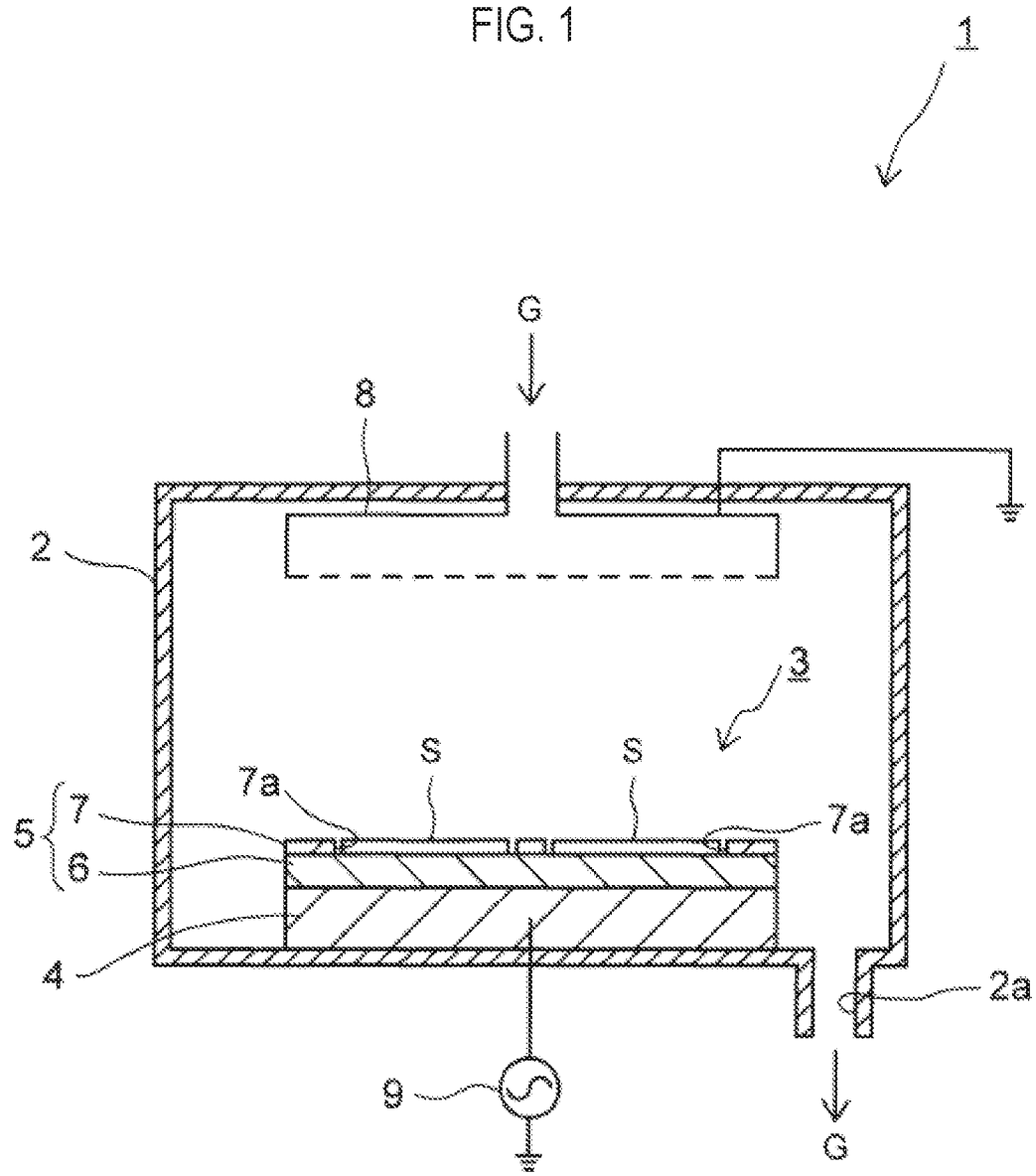
FIG. 1 is a sectional view of a semiconductor manufacturing apparatus used for investigation.

FIG. 1 is a sectional view of a semiconductor manufacturing apparatus used for the investigation.

The semiconductor manufacturing apparatus 1 is a plasma etching apparatus, for example, and includes a chamber 2 and a substrate fixing device 3 accommodated therein.

The substrate fixing device 3 is used to fix a plurality of substrates S in the chamber 2. In this example, the substrate fixing device includes a base plate 4 and a substrate fixture 5 fixed thereon.

The base plate 4 is a conductive plate configured to also function as a lower electrode. In the example, an aluminum plate is used as the base plate 4, and a high-frequency power supply 9 is connected to the base plate 4.

The substrate fixture 5 includes a chuck main body 6 and a tray 7 configured to fix the plurality of substrates S by an electrostatic force, and the substrates S are respectively accommodated in a plurality of openings 7a formed in the tray 7.

A material of the substrate S is not particularly limited. An insulated substrate such as a sapphire substrate or a semiconductor substrate such as a silicon wafer can be used as the substrate S. Also, an LN (lithium niobate) substrate for SAW (Surface Acoustic Wave) device may be used as the substrate S.

Also, an upper electrode 8 is provided to face the substrate fixing device 3 at an upper part of the chamber 2. The upper electrode 8 is configured to also function as a shower head for supplying an etching gas G into the chamber 2.

Also, a discharge port 2a is provided at a lower part of the chamber 2, and the etching gas G is discharged from the discharge port 2a.

When actually used, high-frequency power is applied to the base plate 4 at a state where the chamber 2 is depressurized while keeping the upper electrode 8 at a ground potential, so that plasma is generated from the etching gas G and the substrates S are thus dry etched.

Figure 2:
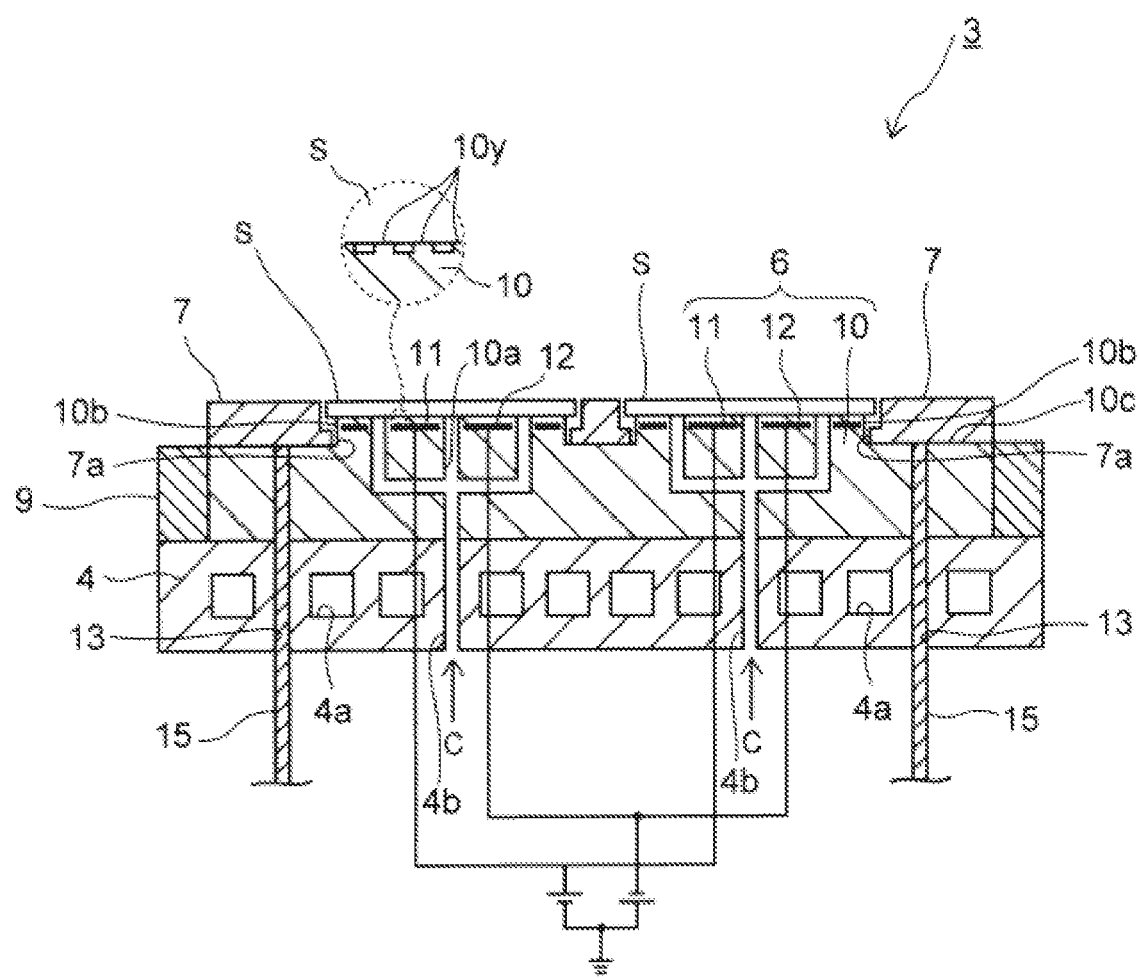
FIG. 2 is a sectional view of a substrate fixing device used for investigation (1 thereof).

FIG. 2 is a sectional view of the substrate fixing device 3.

As shown in FIG. 2, the base plate 4 is provided with flow paths 4a through which cooling water is to circulate, and first gas holes 4b into which a helium gas C for cooling is to be supplied from below.

The cooling water is enabled to circulate in the flow paths 4a, so that the chuck main body 6 and the tray 7 provided thereon are cooled.

Also, the chuck main body 6 includes a ceramics insulated plate 10 such as alumina, and first and second film-shaped electrodes 11, 12 embedded in the insulated plate 10.

The insulated plate 10 is fixed to the base plate 4 by a silicon resin adhesive.

When a positive voltage is applied to the first electrodes 11 and a negative voltage is applied to the second electrodes 12, the electrostatic force acts on the substrates S from the respective electrodes, so that the substrates S are adsorbed to the chuck main body 6. The electrostatic chuck configured to apply voltages having different polarities to the respective electrodes in this way is also referred to as a bipolar electrostatic chuck.

Also, the insulated plate 10 is provided with second gas holes 10a configured to couple to the first gas holes 4b. The helium gas C supplied from the first gas holes 4b pass through the second gas holes 10a and are sprayed to backsides of the substrates S, so that the substrates S are cooled.

Also, as shown in a dotted circle, a surface of the insulated plate 10 is provided with tiny concavity and convexity 10y by blast processing. The helium gas C from the second gas holes 10a passes through gaps of the concavity and convexity 10y, and is spread on the entire backsides of the substrates S, thereby uniformly cooling the substrates S.

Thereby, it is possible to suppress variation in temperature in a surface of the substrate S upon etching, and to prevent variation in etching rate in the substrate surface, which is caused due to the variation in temperature.

Also, an upper surface 10c of the insulated plate 10 is provided with a convex part 10b corresponding to each substrate S, and the opening 7a of the tray 7 is fitted to the convex part 10b.

An outer peripheral surface of the insulated plate 10 is mounted with a focus ring 9 made of alumina for preventing arc from being generated from the plasma atmosphere toward the conductive base plate 4.

Also, the base plate 4 and the insulated plate 10 are respectively formed with holes 13, and lift pins 15 are inserted in the holes 13 to be freely moveable vertically.

Figure 3:
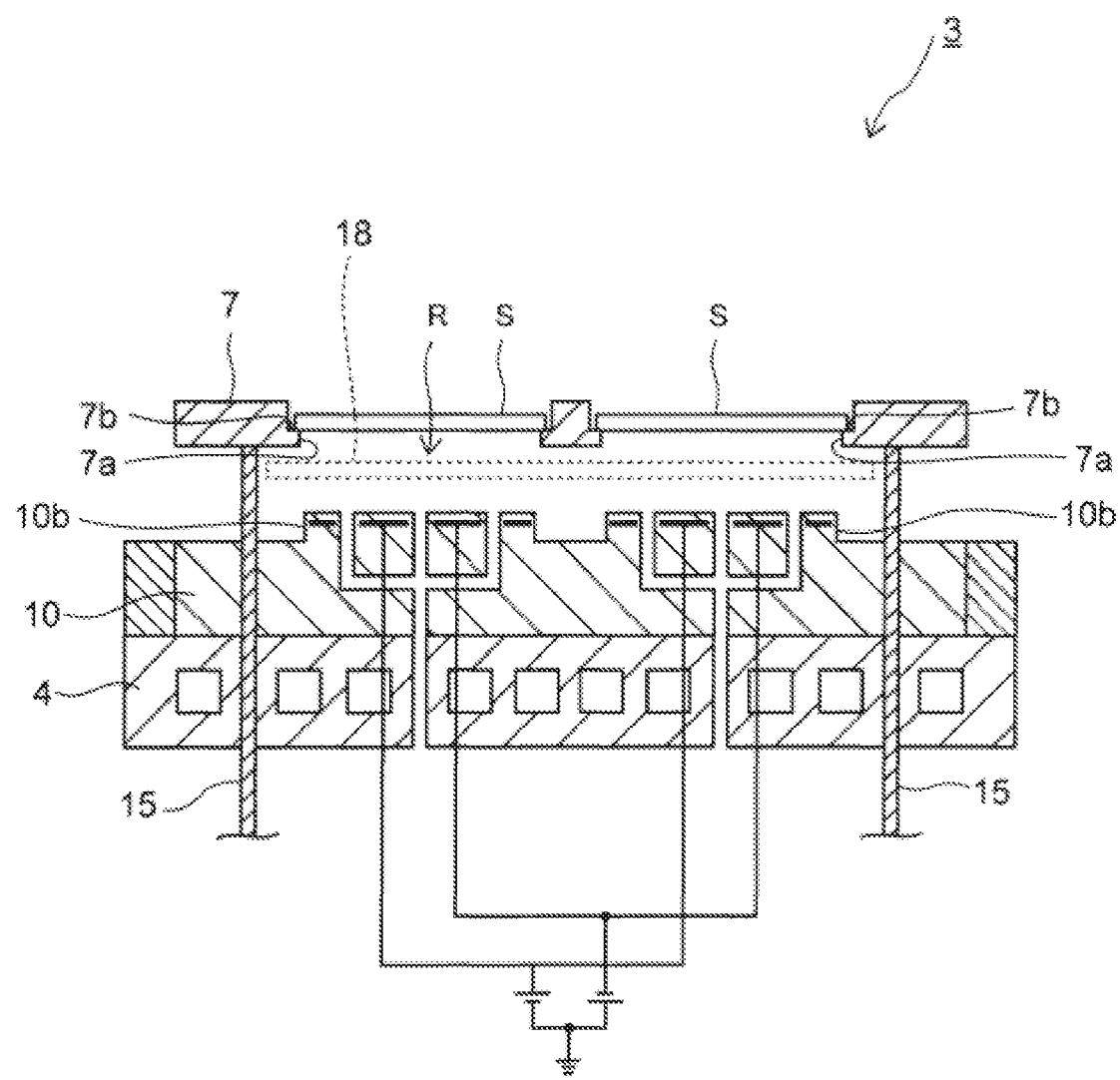
FIG. 3 is a sectional view of the substrate fixing device when lift pins are uplifted.

FIG. 3 is a sectional view of the substrate fixing device 3 when the lift pins 15 are uplifted.

As shown in FIG. 3, when the lift pins 15 are uplifted, the tray 7 is raised from below by the lift pins 15.

At this time, each substrate S is raised together with the tray 7 with being supported to a step surface 7b of the opening 7a. Thereby, a space R into which a conveyor robot 18 is to enter is secured between the insulated plate 10 and the tray 7, so that the conveyor robot 18 can collectively convey the plurality of substrates S together with the tray 7.

Figure 4A:
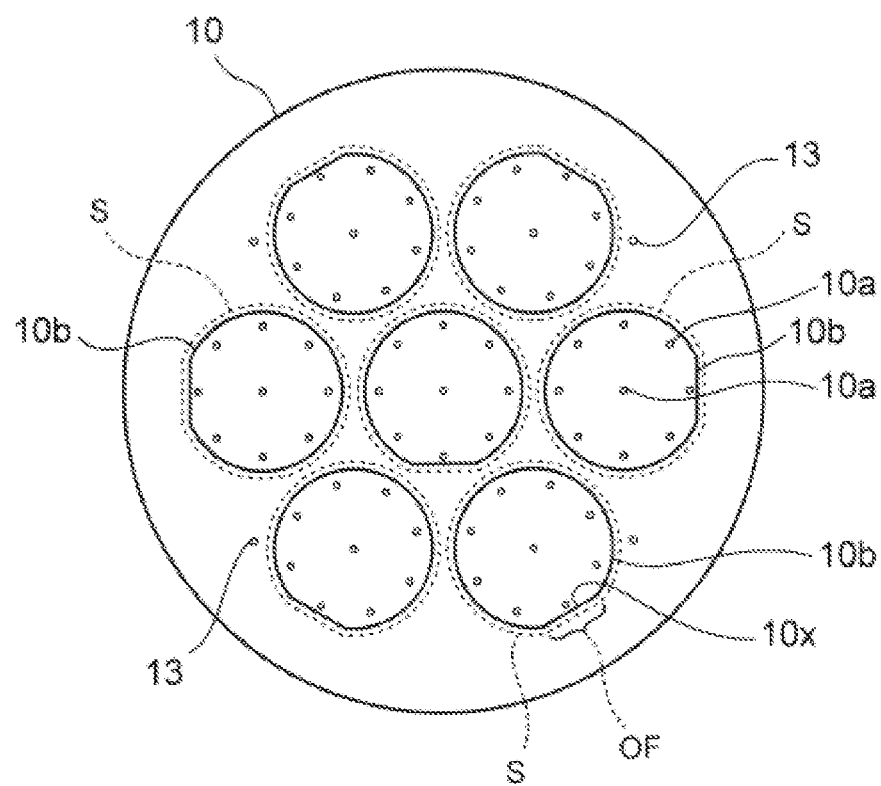
FIG. 4A is a top view of an insulated plate relating to the example of FIG. 2.
Figure 4B:
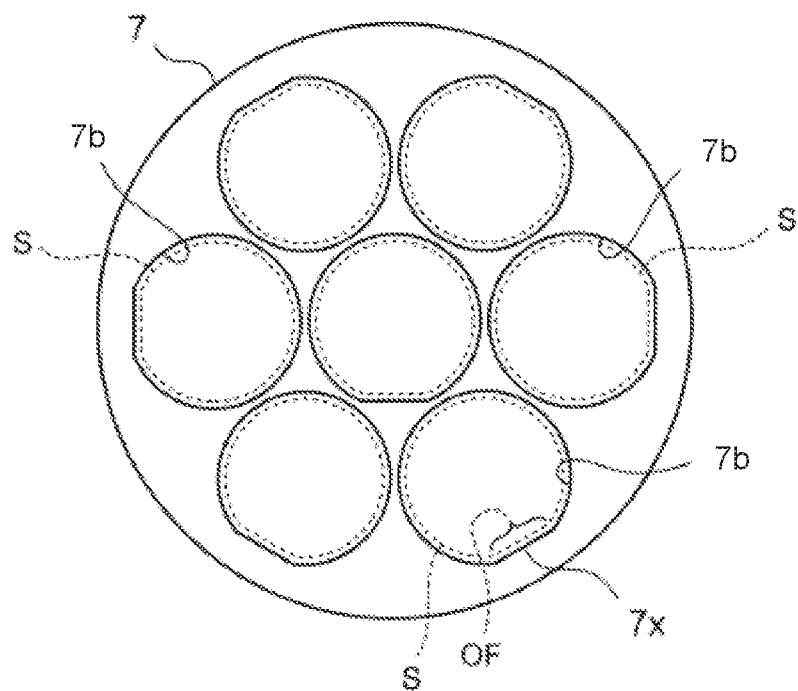
FIG. 4B is a top view of a tray relating to the example of FIG. 2.

FIG. 4A is a top view of the insulated plate 10, and FIG. 4B is a top view of the tray 7.

As shown in FIG. 4A, each convex part 10b of the insulated plate 10 is provided with a flat portion 10x corresponding to an orientation flat OF of the substrate S.

Also, as shown in FIG. 4B, the opening 7a of the tray 7 is provided with a flat portion 7x corresponding to the orientation flat OF of the substrate S.

When actually used, the orientation flat OF of the substrate S is matched with each of the flat portions 7x, 10x, so that the substrate S can be dry etched with the orientation flat OF facing toward a predetermined direction.

According to the substrate fixing device 3, as shown in FIG. 3, since it is possible to collectively convey the plurality of substrates S by the tray 7, it is possible to improve the throughput of a manufacturing process of a semiconductor device.

However, when the flat portion 10x corresponding to the orientation flat OF of the substrate S is provided to the convex part 10b, as shown in FIG. 4A, it is necessary to re-prepare the insulated plate 10 if a shape of the orientation flat OF or a diameter of the substrate S is changed. Since the shape of the orientation flat OF or the diameter of the substrate S may be changed depending on a type of an intended semiconductor device, the manufacturing cost of the substrate fixing device 3 is increased due to the re-preparation and the cost of the semiconductor device is also increased.

In particular, in order to form the insulated plate 10 with the convex parts 10b, it is necessary to work a surface of the insulated plate 10 except for the convex parts 10b for a long time by machine processing, so that the cost of forming the convex parts 10b increases. For this reason, it is preferable to avoid manufacturing the insulated plate 10 for each type of the semiconductor device, from a standpoint of the cost.

In order to avoid the above problem, the inventor investigated a following substrate fixing device.

Figure 5:
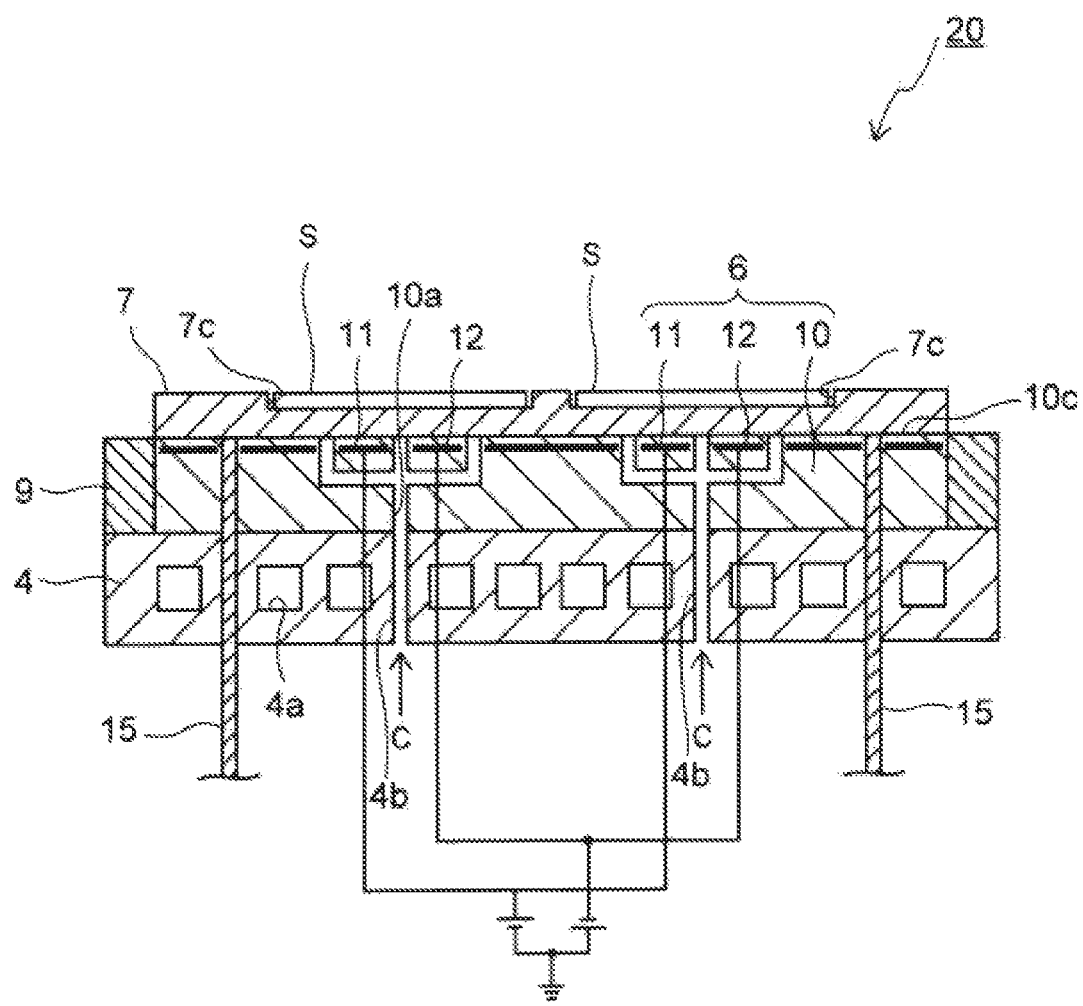
FIG. 5 is a sectional view of the substrate fixing device used for investigation (2 thereof).

FIG. 5 is a sectional view of a substrate fixing device 20 used for the investigation.

Meanwhile, in FIG. 5, the same elements as those of FIGS. 1 to 4B are denoted with the same reference numerals, and the descriptions thereof are omitted.

As shown in FIG. 5, in this example, the upper surface 10c of the insulated plate 10 is configured as a flat surface, and the insulated plate 10 is not provided with the convex parts 10b as shown in FIG. 2.

Also, the tray 7 is provided with a plurality of bottomed concave parts 7c, and the plurality of substrates S is accommodated in the concave parts 7c, respectively.

According to this structure, the electrostatic force is applied from the respective electrodes to the tray 7 and the substrates S, respectively, so that the tray 7 is adsorbed to the insulated plate 10 and the substrates S are adsorbed to the tray 7 by the electrostatic force.

Also, since the tray 7 is cooled from below by the helium gas C supplied from the second gas holes 10a, it is possible to cool the substrates S via the tray 7.

Figure 6A:
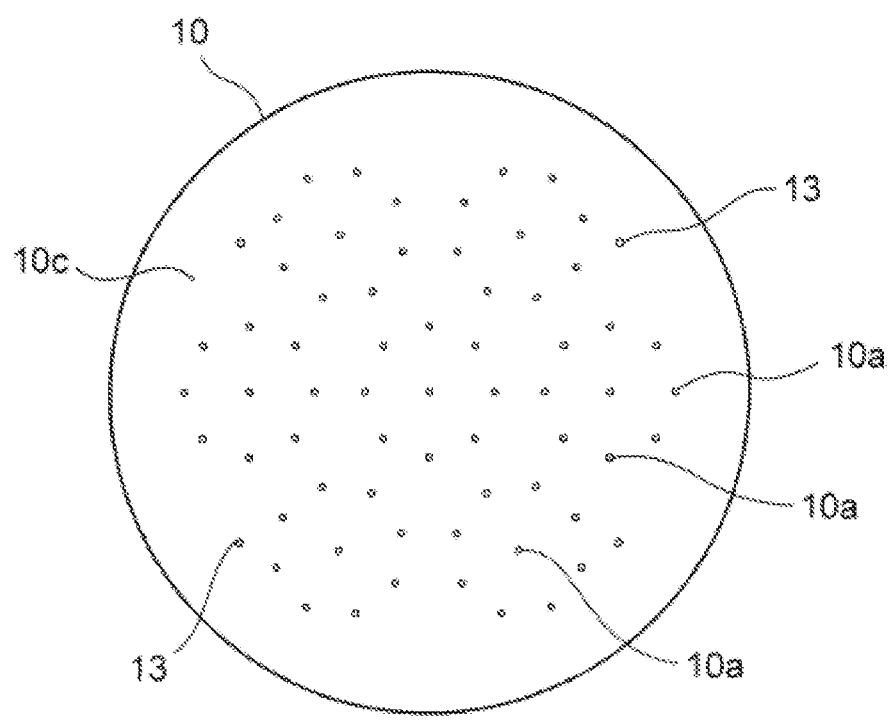
FIG. 6A is a top view of an insulated plate relating to the example of FIG. 5.
Figure 6B:
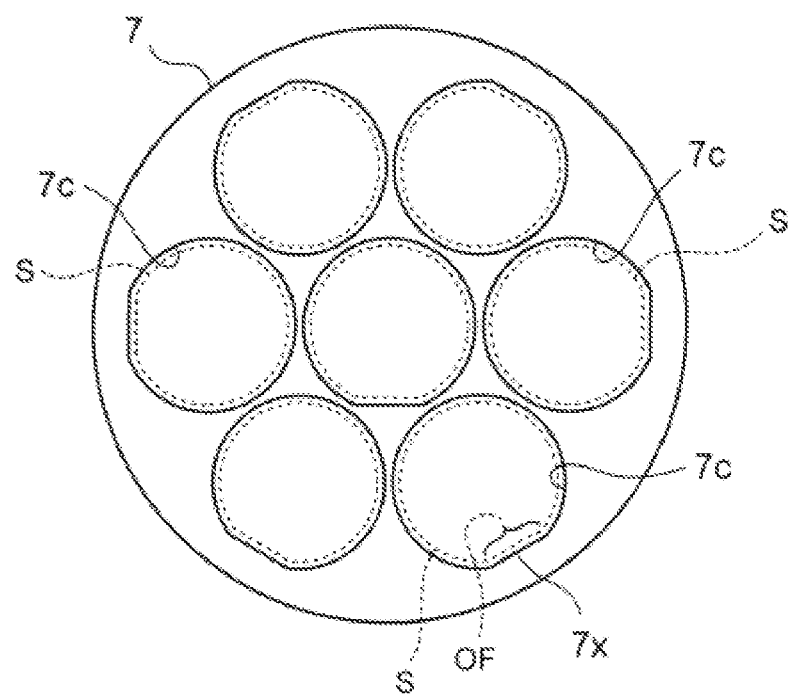
FIG. 6B is a top view of a tray relating to the example of FIG. 5.

FIG. 6A is a top view of the insulated plate 10 relating to the example of FIG. 5, and FIG. 6B is a top view of the tray 7 relating to the example.

As shown in FIG. 6A, the upper surface 10c of the insulated plate 10 is a flat surface, and the second gas holes 10a and the holes 13 are exposed to the flat surface.

Also, as shown in FIG. 6B, the concave part 7c of the tray 7 is provided with the flat portion 7x corresponding to the orientation flat OF of the substrate S. The orientation flat OF is matched with the flat portion 7x, so that the substrate S can be dry etched with the orientation flat OF facing toward a predetermined direction.

According to the substrate fixing device 20, contrary to the example of FIG. 2, the insulated plate 10 is not provided with the convex part 10b conforming to the shape of the substrate S, and the upper surface 10c of the insulated plate 10 is configured as the flat surface.

Therefore, even when the diameter or the orientation flat OF of the substrate S is changed, only the tray 7 may be re-prepared in correspondence to the change. Also, since it is not necessary to re-prepare the insulated plate 10, it is possible to reduce the manufacturing cost of the insulated plate 10.

However, as described in below investigation results, the adsorption force by which the substrate S is adsorbed the tray 7 is extremely weak depending on a combination of the materials of the tray 7 and the insulated plate 10, so that the adsorption force cannot endure the actual using.

Figure 7:
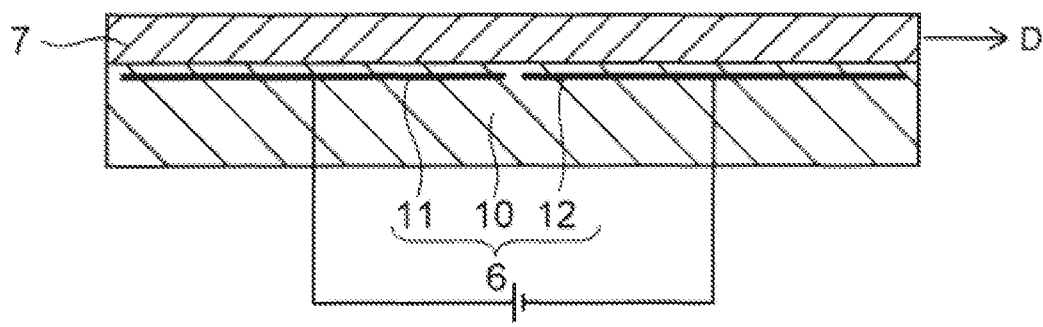
FIG. 7 is a sectional view for illustrating an investigation method of an adsorption force of the tray to a chuck main body.

FIG. 7 is a sectional view for illustrating an investigation method of the adsorption force.

As shown in FIG. 7, in the investigation, both surfaces of the tray 7 were configured as flat surfaces.

Also, the tray 7 was pulled in a lateral direction D with a tension gauge after 10 seconds from the application of the voltage to the respective electrodes 11, 12, and the force by which the tray 7 started to move in the lateral direction D was set as the adsorption force of the tray 7 to the chuck main body 6.

In the meantime, the diameters of the chuck main body 6 and the tray 7 were all 8 inches.

Also, for the insulated plate 10, alumina having a volume resistivity of $1\times10^{12}$ Ωcm was adopted. In the meantime, the volume resistivity of alumina can be controlled by adding titanium or chromium to alumina and adjusting a concentration thereof.

Figure 8:
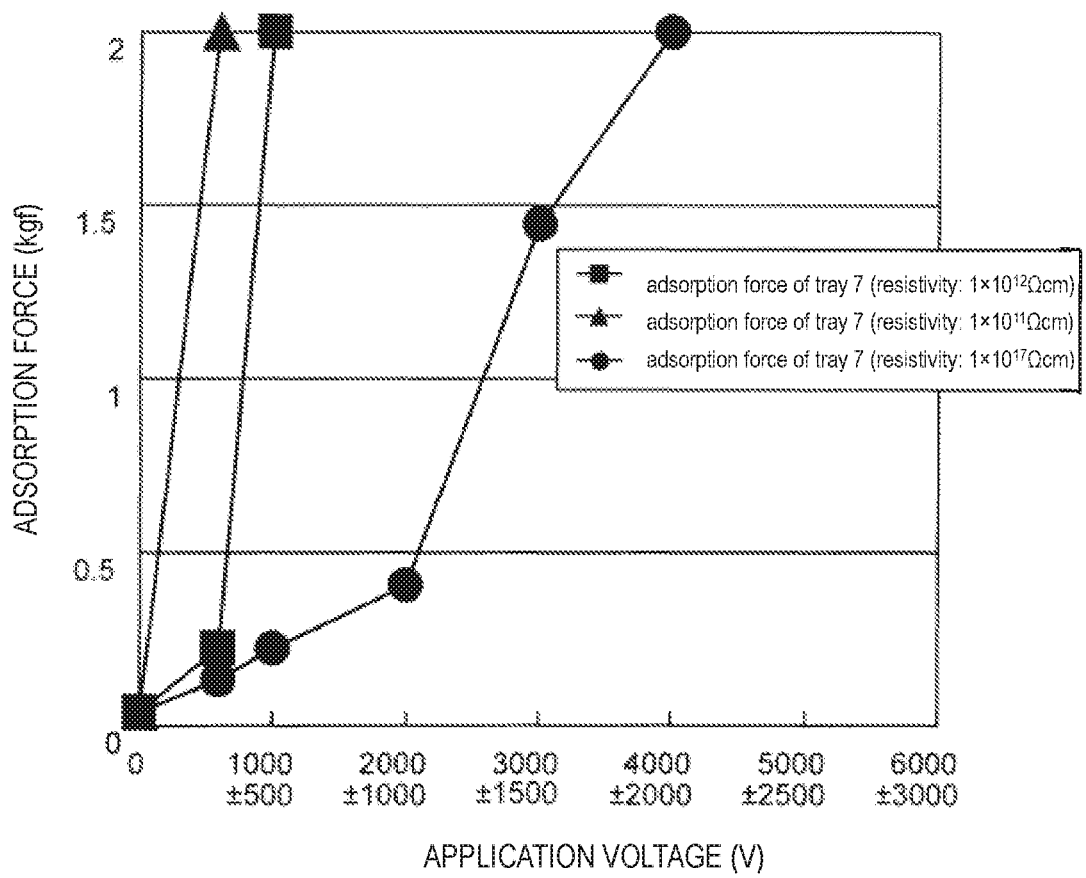
FIG. 8 is a view for illustrating an investigation result of the adsorption force of the tray to the chuck main body.

An investigation result of the adsorption force is shown in FIG. 8.

In the investigation, the adsorption force was measured while changing the application voltage to be applied to the respective electrodes.

In FIG. 8, a horizontal axis indicates the application voltage, and a vertical axis indicates the adsorption force. In the meantime, an application voltage attached with a + symbol on the horizontal axis indicates a positive voltage applied to the first electrode 11, and an application voltage attached with a − symbol indicates a negative voltage applied to the second electrode 12. Also, a voltage having no symbol attached thereto indicates a voltage between the respective electrodes 11, 12.

Also, in the investigation, the three types of the trays 7 of which the volume resistivity was $1\times10^{11}$ Ωcm, $1\times10^{12}$ Ωcm, and $1\times10^{17}$ Ωcm were manufactured by adding titanium to alumina, which was a material of the tray 7, as impurity, and adjusting a concentration of titanium.

As shown in FIG. 8, according to the comparison by the same application voltage, it can be seen that when the volume resistivity of the tray 7 was $1\times10^{11}$ Ωcm, which was the lowest, the adsorption force was strongest, and as the volume resistivity of the tray 7 increased, the adsorption force become weaker.

Empirically, the adsorption force of 2 kgf or higher can endure the actual using. However, according to the result of FIG. 8, it can be seen that even the ceramic tray 7 having the volume resistivity of $1\times10^{17}$ Ωcm could obtain the adsorption force of about 2 kgf when the application voltage was set to 4000V.

From the result, it can be seen that it is possible to obtain a value capable of enduring the actual using, with respect to the adsorption force of the tray 7 to the chuck main body 6.

Then, the inventor investigated the adsorption force of the substrate S to the tray 7.

Figure 9:
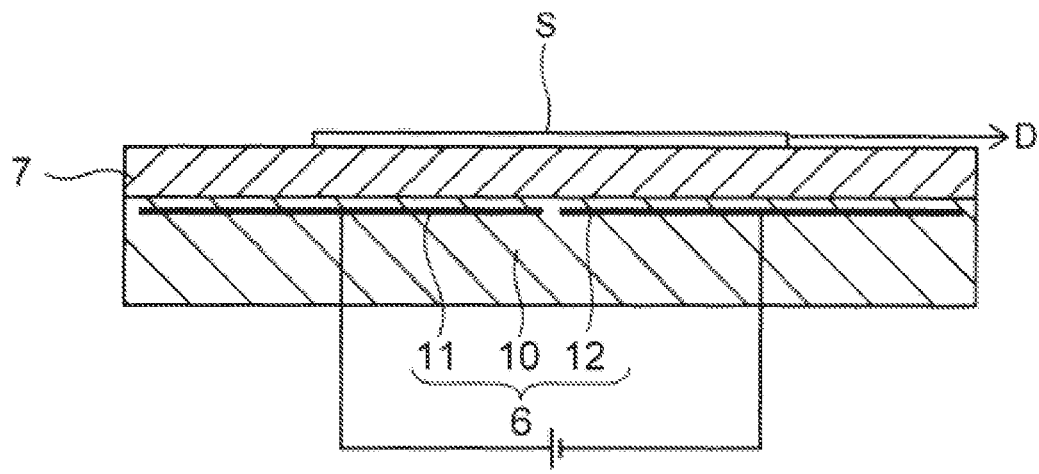
FIG. 9 is a sectional view for illustrating an investigation method of an adsorption force of a substrate to the tray.

FIG. 9 is a sectional view for illustrating an investigation method of the adsorption force of the substrate S.

Meanwhile, in FIG. 9, the same elements as those of FIG. 7 are denoted with the same reference numerals, and the descriptions thereof are omitted.

As shown in FIG. 9, in this investigation, a silicon wafer having a diameter of 4 inches was placed, as the substrate S, on the tray 7 used in the investigation of FIG. 7.

Then, the substrate S was pulled in the lateral direction D with the tension gauge after 10 seconds from the application of the voltage to the respective electrodes, and the force by which the substrate S started to move in the lateral direction D was set as the adsorption force of the substrate S to the tray 7.

Like the investigation of FIG. 7, the diameters of the chuck main body 6 and the tray 7 were all 8 inches, and alumina having the volume resistivity of $1\times10^{12}$ Ωcm was adopted as the material of the insulated plate 10.

Also, as the material of the tray 7, alumina of which the volume resistivity was adjusted by titanium was adopted. Like FIG. 8, the three types of the trays 7 of which the volume resistivity was $1\times10^{11}$ Ωcm, $1\times10^{12}$ Ωcm, and $1\times10^{17}$ Ωcm were manufactured by adjusting the concentration of titanium, and the adsorption force of the substrate S to each tray 7 was investigated.

Figure 10:
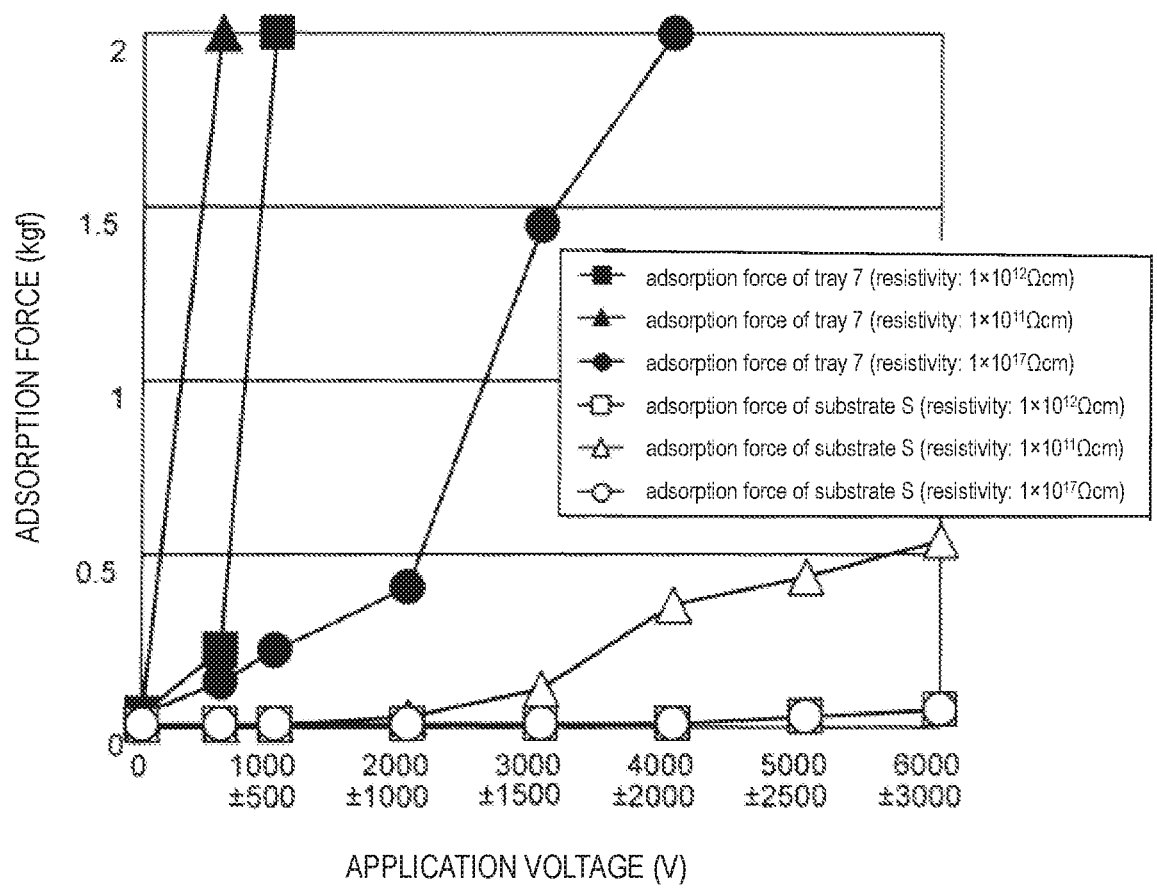
FIG. 10 is a view for illustrating an investigation result of the adsorption force of the substrate to the tray.

An investigation result of the adsorption force is shown in FIG. 10.

In the meantime, like FIG. 8, a horizontal axis of FIG. 10 indicates the application voltage applied to the respective electrodes.

Also, in FIG. 10, the respective graphs of FIG. 8 are also shown for comparison.

As shown in FIG. 10, when the volume resistivity of the tray 7 was $1\times10^{12}$ Ωcm and $1\times10^{17}$ Ωcm, respectively, the adsorption force of the substrate S was extremely weak even though the application voltage was increased. Also, when the volume resistivity of the tray 7 was $1\times10^{11}$ Ωcm, the adsorption force of the tray 7 was low such as about 0.54 kgf even though the application voltage was increased to 6000V. Such adsorption force cannot endure the actual using.

From the result, in the structure where the tray 7 is put on the bipolar chuck main body 6 and the substrate S is adsorbed to the tray 7, like the example of FIG. 5, it can be clearly seen that the adsorption force of the substrate S is extremely low.

Like this, when the adsorption force is weak, the adhesiveness between the tray 7 and the substrate S is deteriorated, so that it is difficult to uniformly cool the substrate S with the tray 7. As a result, a temperature difference occurs in a surface of the substrate S, so that the etching rate is also non-uniform in the surface of the substrate.

Meanwhile, in order to increase the adsorption force of the substrate S to the tray 7, it may be considered to shorten a distance between each electrode 11, 12 and the substrate S by thinning the tray 7. However, since the tray 7 is directly exposed to the plasma atmosphere, it is severely eroded. Therefore, when the tray 7 is thinned, the lifespan of the tray 7 is shortened.

In the below, each exemplary embodiment capable of reducing the cost of the substrate fixing device without lowering the adsorption force and shortening the lifespan is described.

First Exemplary Embodiment

Figure 11:
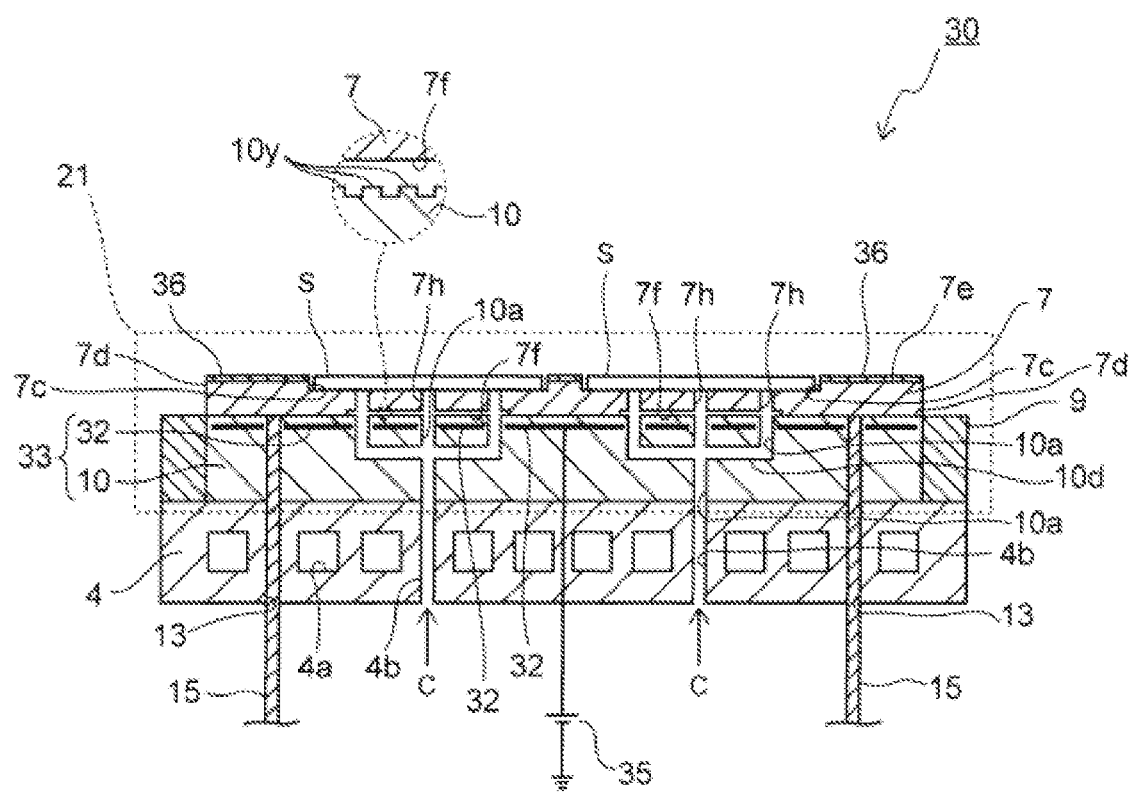
FIG. 11 is a sectional view of a substrate fixing device in accordance with a first exemplary embodiment.

FIG. 11 is a sectional view of a substrate fixing device in accordance with a first exemplary embodiment.

Meanwhile, in FIG. 11, the same elements as those of FIGS. 1 to 6B are denoted with the same reference numerals, and the descriptions thereof are omitted.

A substrate fixing device 30 is used to fix the substrates S in the chamber 2 of FIG. 1, for example, and includes the base plate 4 and a substrate fixture 21 fixed thereon. The process in which the substrate fixing device 30 is to be used is not particularly limited. For example, the substrate fixing device 30 may be used in processes such as dry etching, CVD and the like.

As described above, the base plate 4 is a conductive plate configured to also function as a lower electrode. In the first exemplary embodiment, an aluminum plate having a thickness of about 20 mm to 40 mm is used as the base plate.

In the meantime, the substrate fixture 21 includes a chuck main body 33 and the tray 7 placed thereon.

The chuck main body 33 is a JR (Johnsen-Rahbek)-type electrostatic chuck configured to adsorb the tray 7 and the substrates S by the electrostatic force, and includes the insulated plate 10 and film-shaped electrodes 32 embedded in the insulated plate.

The material of the insulated plate 10 is not particularly limited. In the first exemplary embodiment, alumina having a volume resistivity of $1\times10^{12}$ Ωcm is adopted. As described above, the volume resistivity of alumina can be controlled by adjusting an impurity concentration of titanium or chromium to be added to alumina.

In the meantime, when the impurity concentration is too high, alumina is likely to be eroded due to the etching gas containing halogen such as fluorine and chlorine. Therefore, in order to suppress the erosion, it is preferable to increase the volume resistivity of alumina by adjusting the impurity concentration as low as possible.

Also, the insulated plate 10 is fixed to the base plate 4 by a silicon resin adhesive, for example.

Also, the electrode 32 is a high-melting point metal film such as tungsten film, and is configured to generate the electrostatic force as only a positive voltage of a direct current power supply 35 is applied thereto. Like this, the electrostatic chuck configured to generate the electrostatic force by applying only one voltage of respective electrodes of the direct current power supply 35 to the electrode 32 is also referred to as a monopolar electrostatic chuck.

The manufacturing method of the insulated plate 10 is also not particularly limited. For example, it is possible to manufacture the insulated plate 10 having a thickness of 3 mm to 5 mm by stacking, heating and sintering a plurality of green sheets of alumina. At this time, when a pattern of tungsten film is formed in advance on one of the plurality of green sheets, it is possible to obtain the insulated plate 10 having the tungsten electrodes 32 embedded therein, as described above.

Also, the insulated plate 10 is provided with the second gas holes 10a through which the helium gas C for cooling is to flow. The gas holes 10a are formed to penetrate the insulated plate 10 by laser processing, for example.

In the meantime, the gas hole 10a is provided with a branched flow path 10d branched in the lateral direction at a depth on the way of the insulated plate 10. The branched flow path 10d may be formed by forming a groove corresponding to a shape of the branched flow path 10d at a part of the green sheet of alumina.

In the meantime, the tray 7 is an insulated plate having a thickness of about 0.5 mm to 3.0 mm for collectively conveying the plurality of substrates S, and the concave parts 7c corresponding to the substrates S are formed in an upper surface 7e thereof.

The concave part 7c may be formed to have a depth of about 0.1 mm to 1.5 mm by machine processing or sand blast, for example.

Also, the concave part 7c is formed with third gas holes 7h configured to couple to the second gas holes 10a of the insulated plate 10 by laser processing. The third gas holes 7h are configured to directly eject the helium gas C for cooling supplied from the second gas holes 10a to the backside of the substrate S, so that it is possible to cool the substrate S.

In the meantime, a lower surface of the tray 7 is placed to contact an upper surface of the insulated plate 10.

Also, the lower surface of the tray 7 is formed with grooves 7f configured to couple to the plurality of third gas holes 7h. Thereby, the helium gas C passes through the grooves 7f, and uniformly collides with the backside of the substrate S from each of the plurality of third gas holes 7h, so that it is possible to suppress variation in temperature in the surface of the substrate S.

Particularly, in the first exemplary embodiment, as shown in a dotted circle, the surface of the insulated plate 10 is provided with the tiny concavity and convexity 10y by blast processing. The concavity and convexity 10y acts to uniformize the flow of the helium gas C. Therefore, the helium gas C is uniformly distributed to each of the plurality of third gas holes 7h, so that it is possible to further uniformize an amount of the helium gas C to collide with the backside of the substrate S.

Also, as the material of the tray 7, insulating ceramic can be adopted. As the ceramic, alumina may be exemplified. In the first exemplary embodiment, the tray 7 is formed of alumina having titanium added thereto as impurity and the volume resistivity of the tray 7 is set to the volume resistivity or lower of the insulated plate 10 by increasing the concentration of titanium.

In the meantime, as the impurity, chromium may be added to the tray 7, instead of titanium.

In this way, the volume resistivity of the tray 7 is set to be equal to or lower than the volume resistivity of the insulated plate 10, so that it is possible to increase the adsorption force of the substrate S to the tray 7, as described later.

Alumina having the high-concentration impurity added thereto is more likely to be eroded in the plasma atmosphere, as compared to alumina having higher purity.

Therefore, in the first exemplary embodiment, in order to protect the tray 7 from the plasma atmosphere, the upper surface 7e of the tray 7 is formed with an yttrium oxide layer 36 such as yttria ($Y_2O_3$) having a thickness of about 50 μm to 500 μm by thermal spraying.

As compared to the tray 7 formed of alumina having titanium or chromium added thereto, yttria has difficulty in being eroded in the plasma atmosphere containing halogen such as fluorine and chlorine. For this reason, it is possible to prevent the tray 7 from being eroded in the plasma atmosphere by the yttrium oxide layer 36, so that it is possible to prolong the lifespan of the tray 7.

Particularly, in the first exemplary embodiment, the yttrium oxide layer 36 is formed only on the upper surface 7e. Thereby, it is possible to reduce the labor of forming the yttrium oxide layer 36 in the concave parts 7c and on the outer peripheral surface 7d of the tray 7, so that it is possible to simplify the manufacturing process of the tray 7.

Meanwhile, in order to form the yttrium oxide layer 36 only on the upper surface 7e, it is preferable to thermally spray yttria to the tray 7 with the insides of the concave parts 7c and the outer peripheral surface 7d of the tray 7 being covered by a mask material such as polyimide resin or the like.

Also, a high-purity alumina film, which is difficult to be eroded by the plasma atmosphere containing halogen such as chlorine and fluorine, may be formed instead of the yttrium oxide layer 36.

Figure 12:
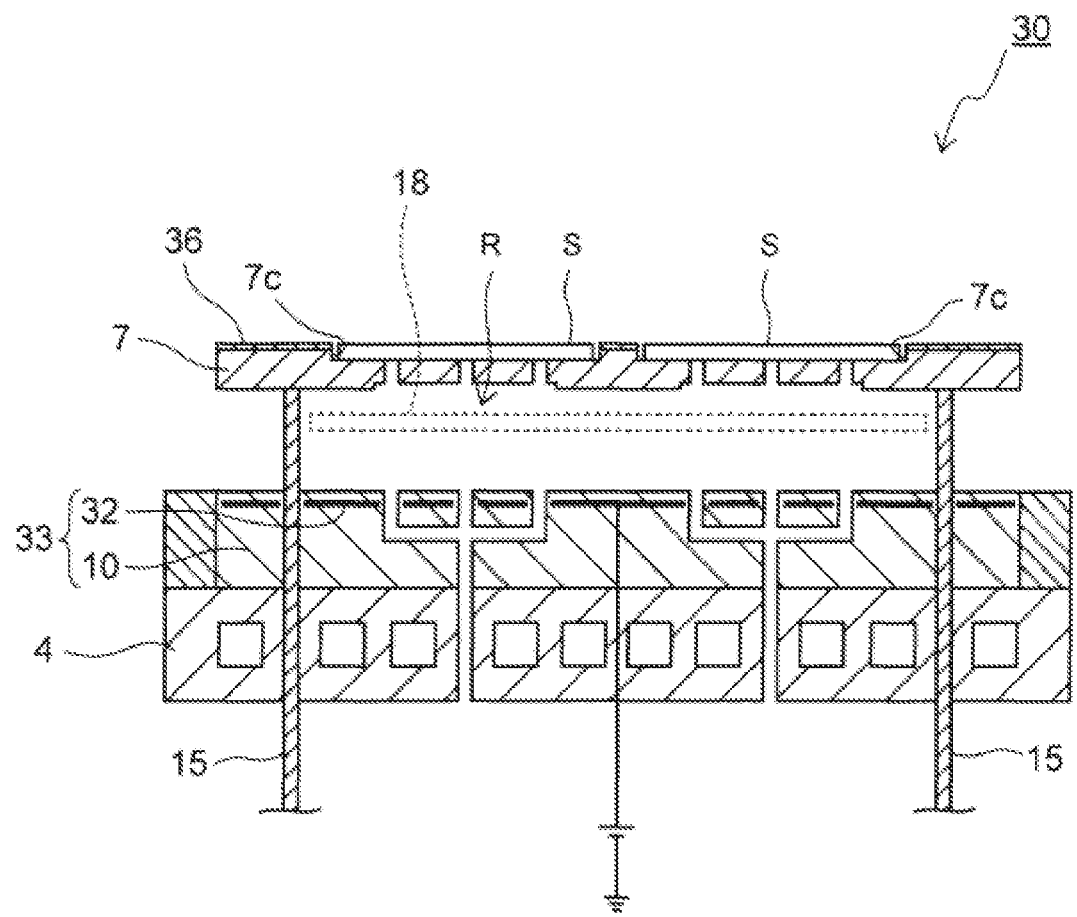
FIG. 12 is a sectional view of the substrate fixing device in accordance with the first exemplary embodiment when lift pins are uplifted.

FIG. 12 is a sectional view of the substrate fixing device 30 when the lift pins 15 are uplifted.

As shown in FIG. 12, the lift pins 15 are uplifted, so that the tray 7 is raised from below. Thereby, the space R into which the conveyor robot 18 is to enter is secured between the chuck main body 33 and the tray 7, so that the conveyor robot 18 can collectively convey the plurality of substrates S together with the tray 7.

Figure 13:
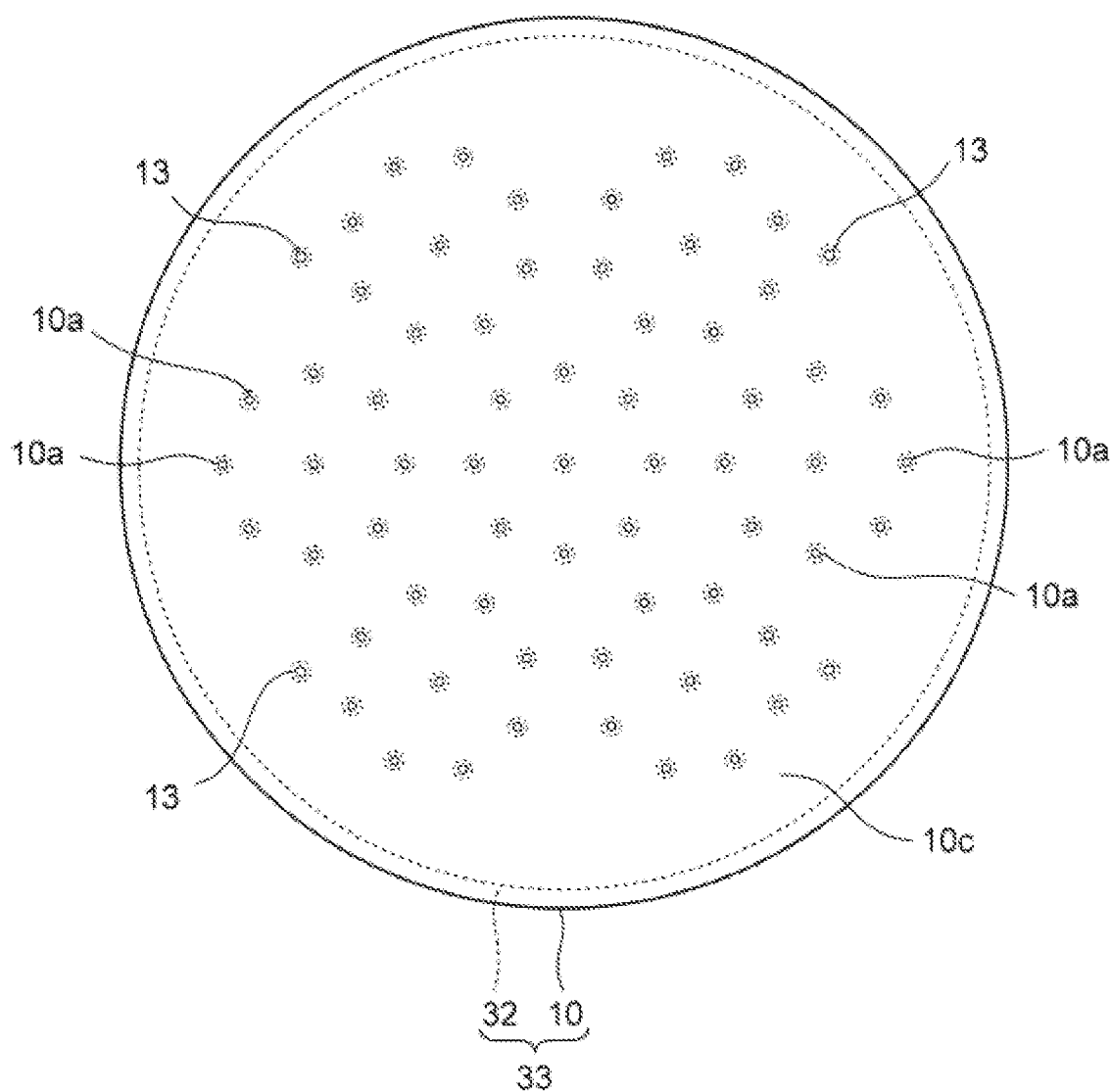
FIG. 13 is a top view of a chuck main body in accordance with the first exemplary embodiment.

FIG. 13 is a top view of the chuck main body 33 in accordance with the first exemplary embodiment.

As shown in FIG. 13, the insulated plate 10 is substantially circular, as seen from above, and a diameter thereof is 12 inches, for example.

The upper surface 10c of the insulated plate 10 is a flat surface, and the second gas holes 10a and the holes 13 are exposed to the upper surface 10c.

Also, the electrode 32 is a single film that has not been separated into a plurality of portions, as seen from above.

Figure 14:
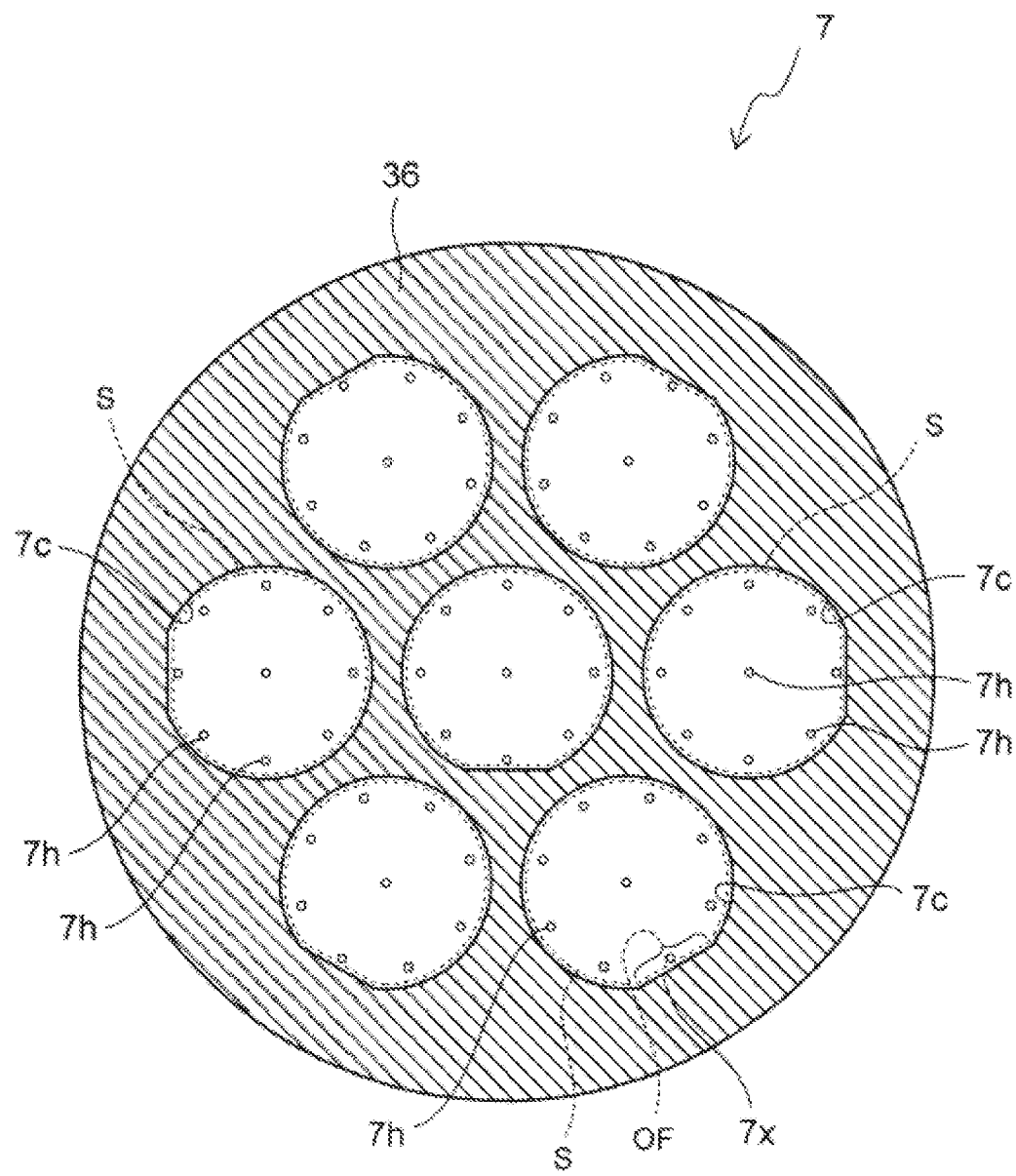
FIG. 14 is a top view of a tray in accordance with the first exemplary embodiment.

FIG. 14 is a top view of the tray 7 in accordance with the first exemplary embodiment.

As shown in FIG. 14, the yttrium oxide layer 36 is formed on the entire surface of the upper surface of the tray 7, except for the concave parts 7c.

Also, each concave part 7c is provided with the flat portion 7x corresponding to the orientation flat OF of the substrate S, and the substrate S is accommodated in each concave part 7c so that the orientation flat OF fits with the flat portion 7x.

The shape and size of the tray 7 are not particularly limited. In the first exemplary embodiment, like the insulated plate 10, the tray 7 is substantially circular and has a diameter of 12 inches. The diameter of each substrate S is 4 inches, and the diameter of the concave part 7c is correspondingly about 4 inches. According to this configuration, it is possible to collectively convey the seven substrates S by one tray 7.

Figure 15:
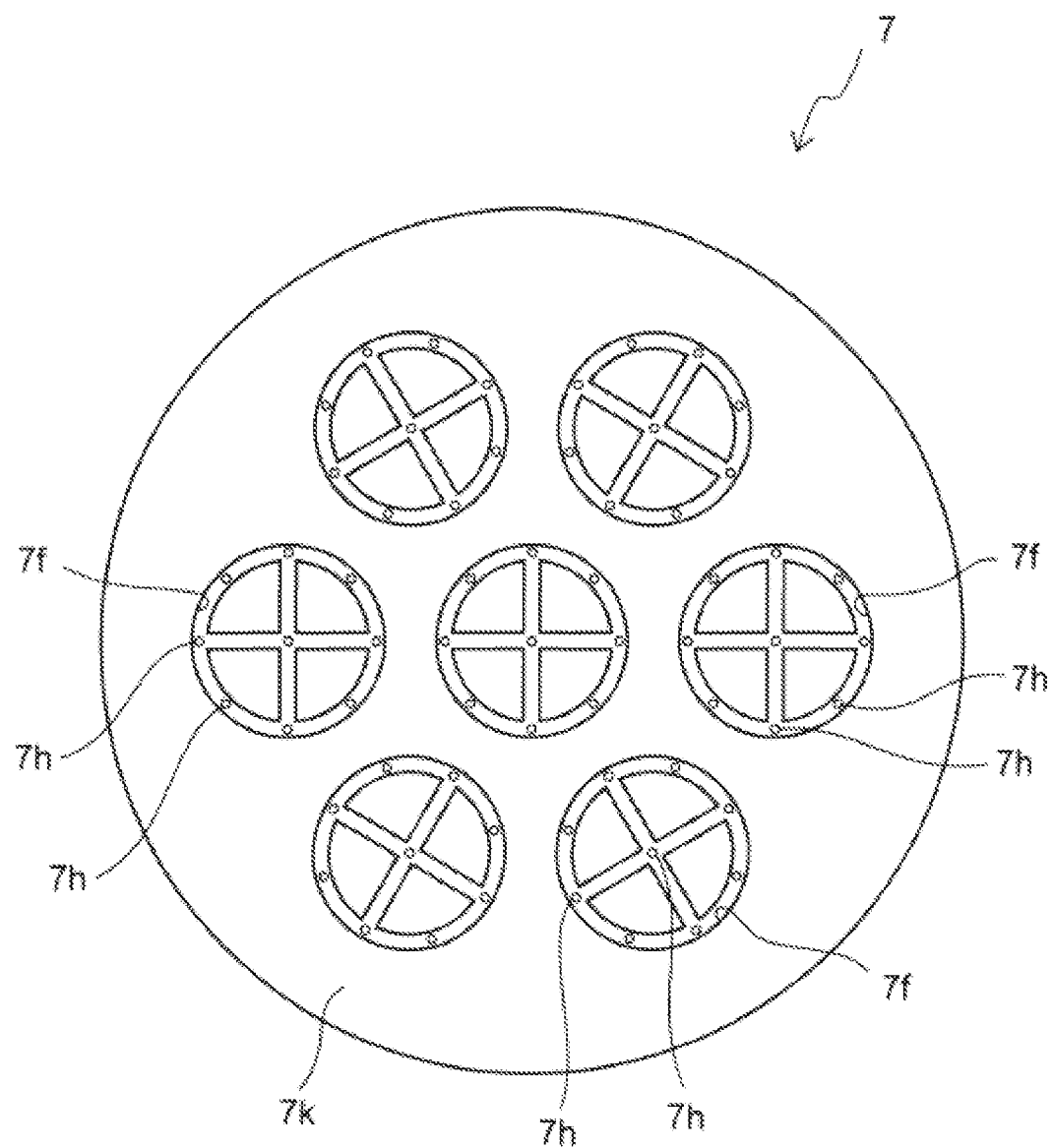
FIG. 15 is a bottom view of the tray in accordance with the first exemplary embodiment.

FIG. 15 is a bottom view of the tray 7.

As shown in FIG. 15, a lower surface 7k of the tray 7 is formed with the grooves 7f. The groove 7f has a substantial ring shape corresponding to each substrate S, is configured to couple the plurality of third gas holes 7h corresponding to each substrate S.

The inventor investigated the adsorption force of the tray 7 to the chuck main body 33 and the adsorption force of the substrate S to the tray 7 of the first exemplary embodiment.

Figure 16:
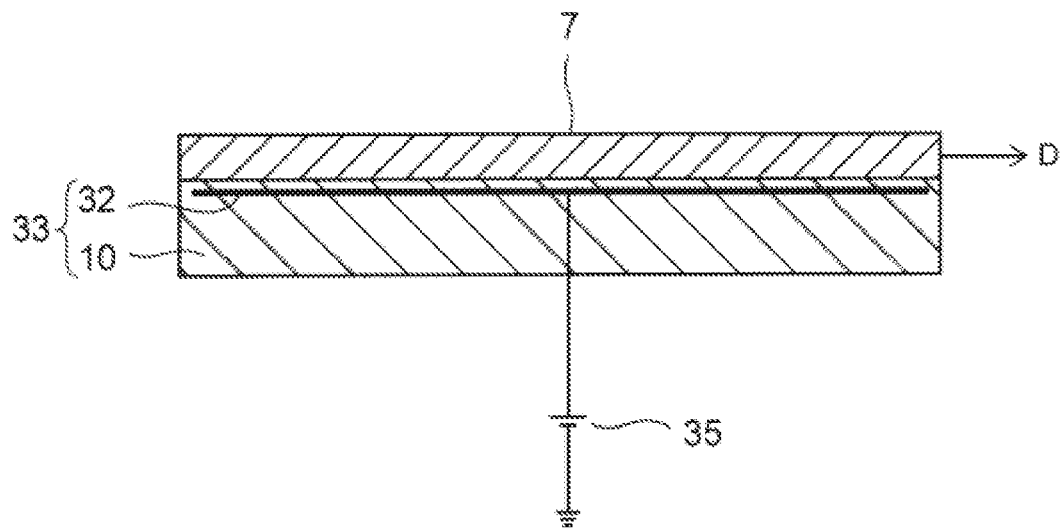
FIG. 16 is a sectional view for illustrating an investigation method of an adsorption force of the tray to the chuck main body, in the first exemplary embodiment.

FIG. 16 is a sectional view for illustrating an investigation method of the adsorption force of the tray 7 to the chuck main body 33.

In the investigation, the tray 7 has both flat surfaces.

Also, the tray 7 was pulled in the lateral direction D with the tension gauge after 10 seconds from the application of the positive voltage to the electrode 32 from the direct current power supply 35, and the force by which the tray 7 started to move in the lateral direction D was set as the adsorption force of the tray 7 to the chuck main body 33.

In the meantime, the diameters of the chuck main body 33 and the tray 7 were all 8 inches.

Also, alumina having titanium added thereto was used as the material of the insulated plate 10 of the chuck main body 33, and the volume resistivity of the insulated plate 10 was set to $1 \times 10^{12}$ Ωcm by adjusting the concentration of titanium.

Figure 17:
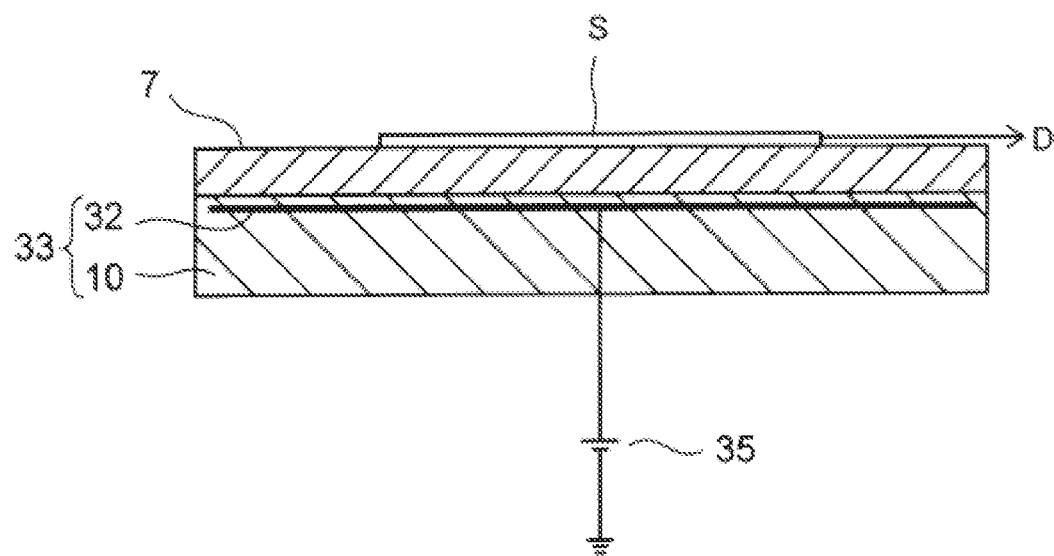
FIG. 17 is a sectional view for illustrating an investigation method of an adsorption force of the substrate to the tray, in the first exemplary embodiment.

FIG. 17 is a sectional view for illustrating an investigation method of the adsorption force of the substrate S to the tray 7.

As shown in FIG. 17, in the investigation, a silicon wafer having a diameter of 4 inches was placed on the tray 7 of FIG. 16, as the substrate S.

Like FIG. 16, the substrate S was pulled in the lateral direction D with the tension gauge after 10 seconds from the application of the positive voltage to the electrode 32 from the direct current power supply 35, and the force by which the substrate S started to move in the lateral direction D was set as the adsorption force of the substrate S to the tray 7.

Figure 18:
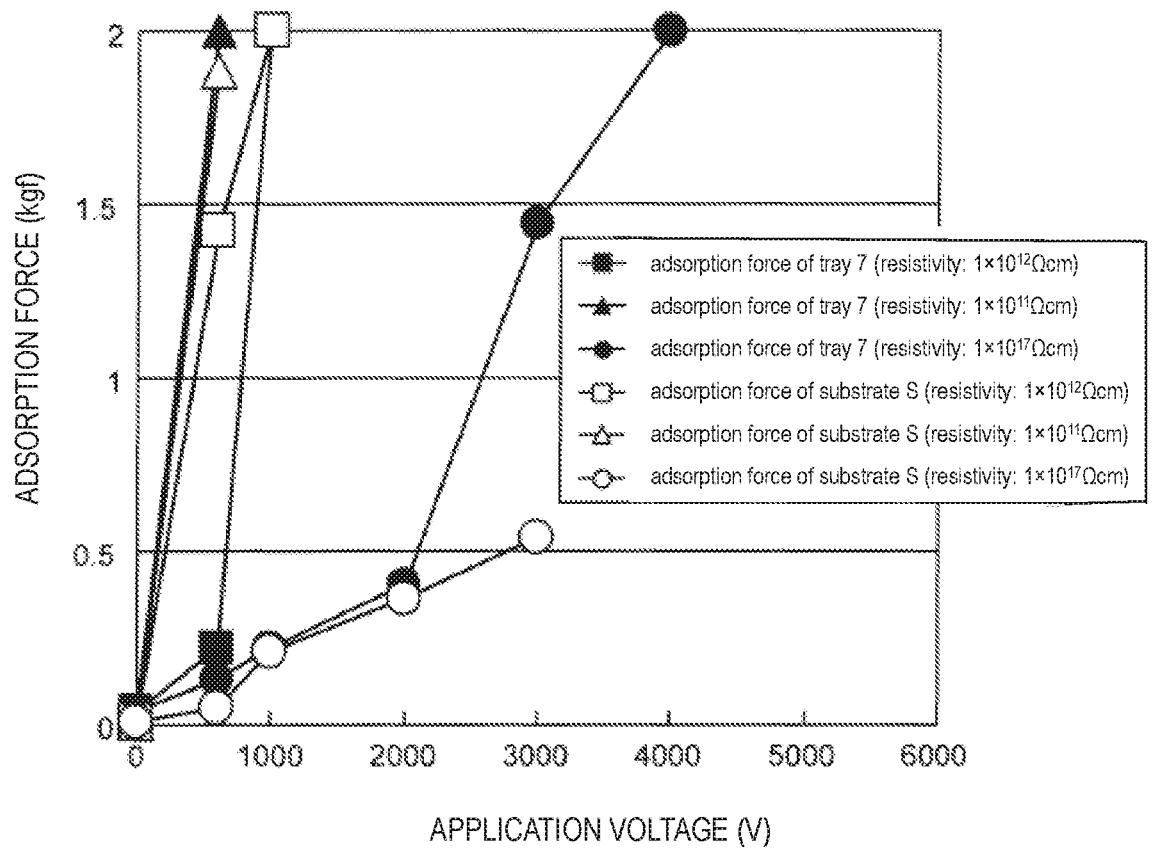
FIG. 18 depicts an investigation result of the adsorption force of the tray to the chuck main body and an investigation result of the adsorption force of the substrate to the tray, in the first exemplary embodiment.

The investigation result of the adsorption force is shown in FIG. 18.

In FIG. 18, a horizontal axis indicates the positive voltage applied from the direct current power supply 35 to the electrode 32, and a vertical axis indicates the adsorption force.

In the investigation, the three types of the trays 7 of which the volume resistivity was $1 \times 10^{11}$ Ωcm, $1 \times 10^{12}$ Ωcm, and $1 \times 10^{17}$ Ωcm were manufactured by adding titanium to alumina, which was a material of the tray 7, as impurity, and adjusting a concentration of titanium.

As shown in FIG. 18, regarding the adsorption force of the tray 7 to the chuck main body 33, it can be seen that the values of 2 kgf or greater capable of enduring the actual using were obtained by increasing the application voltage in all cases of the volume resistivity of the tray 7 of $1\times10^{11}$ Ωcm, $1\times10^{12}$ Ωcm, and $1\times10^{17}$ Ωcm.

In the meantime, regarding the adsorption force of the substrate S to the tray 7, the adsorption force of 2 kgf or greater capable of enduring the actual using was not obtained even by increasing the application voltage, when the volume resistivity of the tray 7 was $1\times10^{17}$ Ωcm greater than the volume resistivity of the insulated plate 10.

However, in the case of the tray 7 of which the volume resistivity was $1\times10^{11}$ Ωcm and $1\times10^{12}$ Ωcm equal to or lower than the volume resistivity of the insulated plate 10, respectively, it can be seen that the adsorption force of 2 kgf or greater was obtained even with the application voltage of about 1000V.

From the above result, it can be clearly seen that it is effective to set the volume resistivity of the tray 7 of the monopolar electrostatic chuck to the volume resistivity or lower of the insulated plate 10 when it is intended to increase the adsorption force of the substrate S to the tray 7 to a value capable of enduring the actual using.

Figure 19:
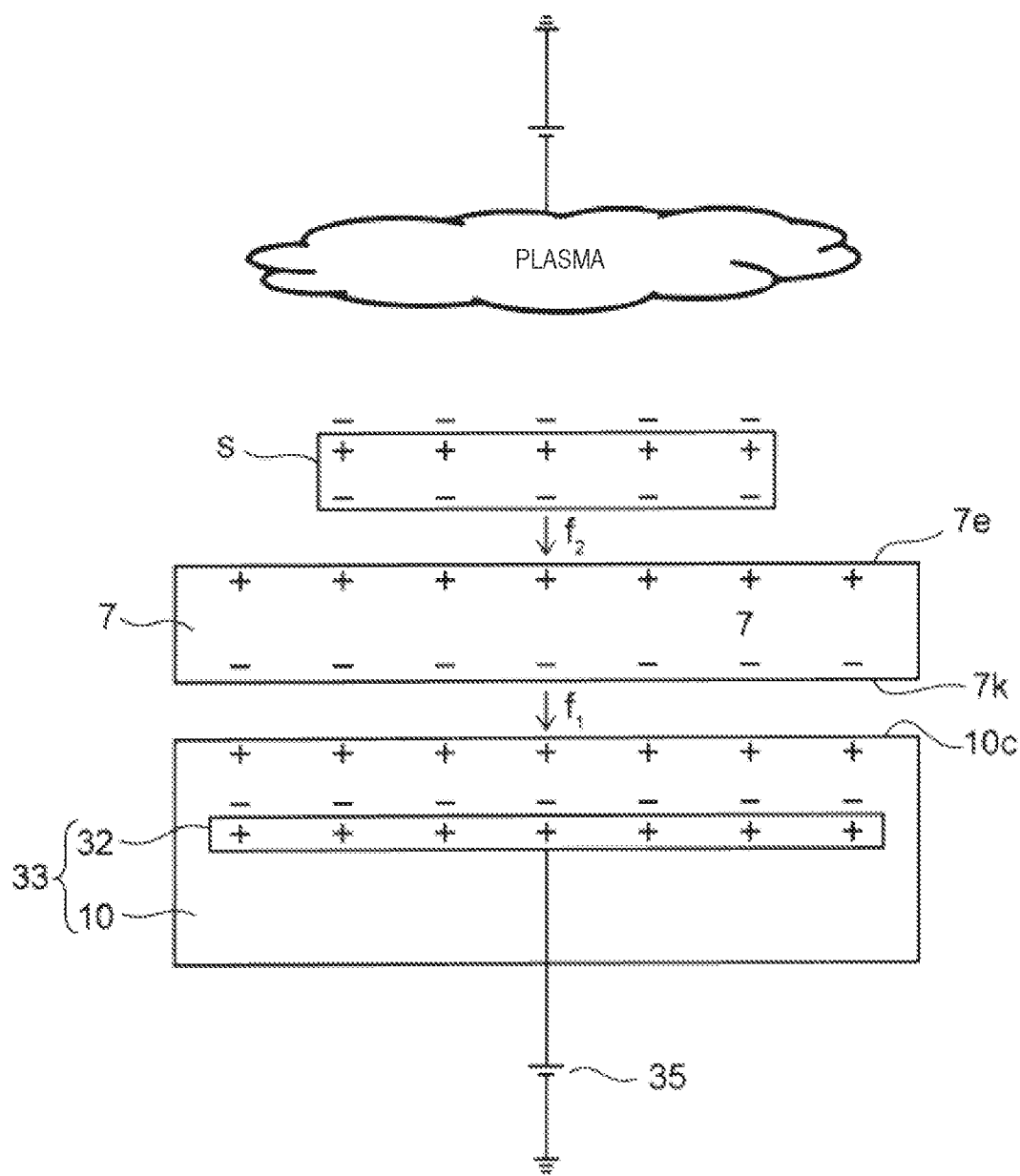
FIG. 19 is a pictorial sectional view for illustrating a reason that the adsorption force increases in the first exemplary embodiment.

FIG. 19 is a pictorial sectional view for illustrating the reason that the adsorption force increases.

As shown in FIG. 19, when the positive voltage is applied to the electrode 32 from the direct current power supply 35, dielectric polarization occurs in the insulated plate 10, so that positive charges are induced in the upper surface 10c of the insulated plate 10.

Correspondingly, the dielectric polarization occurs in the tray 7, so that negative charges and positive charges are respectively induced in the lower surface 7k and the upper surface 7e of the tray 7. By the positive charges induced in the upper surface 7e, the dielectric polarization also occurs in the substrate S, so that negative charges are generated in the backside of the substrate S.

As a result, the tray 7 is adsorbed to the insulated plate 10 by the electrostatic force f1 generated between the insulated plate 10 and the tray 7, and the substrate S is adsorbed to the tray 7 by the electrostatic force f2 generated between the tray 7 and the substrate S.

The inventor considered that when the volume resistivity of the tray 7 is appropriately lowered, the tray 7 is likely to be polarized and an amount of the positive charged to be induced in the upper surface 7e increases. Thereby, it is thought that the electrostatic force f2 became greater and the adsorption force of the substrate S to the tray 7 was thus increased.

According to the first exemplary embodiment, when the volume resistivity of the tray 7 of the monopolar electrostatic chuck is set to the volume resistivity or lower of the insulated plate 10, it is possible to adsorb the substrate S to the tray 7 with the sufficient adsorption force.

Thereby, since it is not necessary to directly adsorb the substrate S to the insulated plate 10, it is not necessary to provide the insulated plate 10 with the convex part 10b for adsorbing the substrate S, like FIG. 2. Therefore, when the shape of the orientation flat OF of the substrate S or the diameter of the substrate S is changed, only the tray 7 may be re-prepared in conformity to a new substrate S, and the insulated plate 10 is not required to be re-prepared. As a result, it is possible to reduce the costs of the substrate fixture 21 (refer to FIG. 11) and the substrate fixing device 30 without lowering the adsorption force of the tray 7 to the insulated plate 10.

Also, the adsorption force of the substrate S to the tray 7 is increased, so that the substrate S is difficult to separate from the tray 7 by the pressure of the helium gas C to be supplied from the third gas holes 7h (refer to FIG. 11). As a result, it is possible to uniformly cool the substrate S by the helium gas C while securely adsorbing the substrate S to the tray 7. Also, it is possible to suppress the variation in etching rate in the substrate surface, which is caused due to the variation in temperature in the surface of the substrate S.

Also, since it is not necessary to provide the tray 7 with a special structure so as to increase the adsorption force of the substrate S, the tray 7 can be formed of an insulator such as alumina, so that it is also possible to suppress the manufacturing cost of the tray 7.

Since it is possible to protect the tray 7 from the plasma atmosphere by the yttrium oxide layer 36 formed on the upper surface 7e of the tray 7, it is possible to prolong the lifespan of the tray 7.

Also, when the yttrium oxide layer 36 is etched and thinned due to the using for a long time, only the yttrium oxide layer 36 may be again formed and the tray 7 is not required to be replaced. Therefore, it is possible to save the operational cost of the tray 7.

Second Exemplary Embodiment

In a second exemplary embodiment, a range in which the yttrium oxide layer 36 is to be formed is extended, as compared to the first exemplary embodiment.

FIG. 20 is a sectional view of the tray 7 in accordance with the second exemplary embodiment.

In FIG. 20, the same elements as the first exemplary embodiment are denoted with the same reference numerals as the first exemplary embodiment, and the descriptions thereof are omitted.

As shown in FIG. 20, in the second exemplary embodiment, the yttrium oxide layer 36 is formed not only on the upper surface 7e of the tray 7 but also on the outer peripheral surface 7d of the tray 7 and side surfaces 7m of the concave parts 7c. Also, the yttrium oxide layer 36 is formed on a part, which is around the substrate S, of a bottom surface 7g of the concave part 7c.

Thereby, as compared to the first exemplary embodiment, a surface of the tray 7 to be covered by the yttrium oxide layer 36 is extended, so that it is possible to protect the tray 7 from the plasma atmosphere over a wider range than the first exemplary embodiment.

Third Exemplary Embodiment

In a third exemplary embodiment, a tray that can be more easily manufactured than the first exemplary embodiment is described.

FIG. 21 is a sectional view of the tray 7 in accordance with the third exemplary embodiment.

In FIG. 21, the same elements as the first exemplary embodiment and the second exemplary embodiment are denoted with the same reference numerals as the first and second exemplary embodiments, and the descriptions thereof are omitted.

As shown in FIG. 21, the tray 7 of the third exemplary embodiment includes a lower plate 41 and an upper plate 42.

Both the lower plate 41 and the upper plate 42 are alumina plates to which titanium is added as impurity, and each volume resistivity thereof is set to the volume resistivity or lower of the insulated plate 10 (refer to FIG. 11) by increasing the concentration of titanium, like the first exemplary embodiment.

Also, the upper plate 42 can be detachably mounted to an upper surface 41a of the lower plate 41, and has a plurality of openings 42a. By the openings 42a and the upper surface 41a, the concave parts 7c are demarcated.

Also, when the diameter of the substrate S is changed, for example, only the upper plate 42 may be re-prepared in conformity to a new substrate S, and the lower plate 41 is not required to be re-prepared. As a result, it is possible to save the cost relating to the re-preparation, as compared to a configuration where the entire tray 7 is to be re-prepared.

Figure 22:
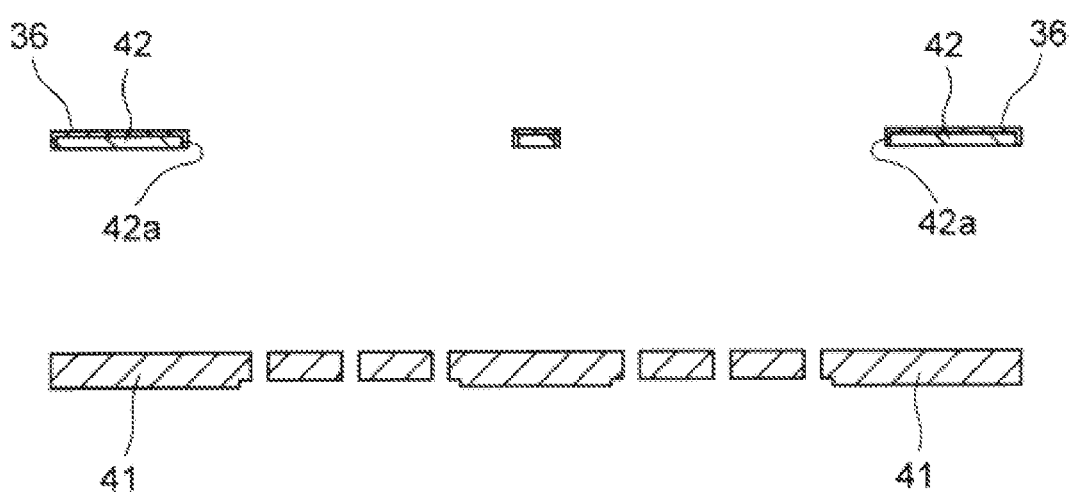
FIG. 22 is a sectional view when an upper plate is demounted from a lower plate, in the third exemplary embodiment.

FIG. 22 is a sectional view when the upper plate 42 is demounted from the lower plate 41.

Since it is mainly the upper plate 42 that is exposed to the plasma atmosphere, the yttrium oxide layer 36 for protecting the tray 7 from the plasma atmosphere is formed only on the upper plate 42 and the lower plate 41 is not formed with the yttrium oxide layer 36, in the third exemplary embodiment.

Figure 23:
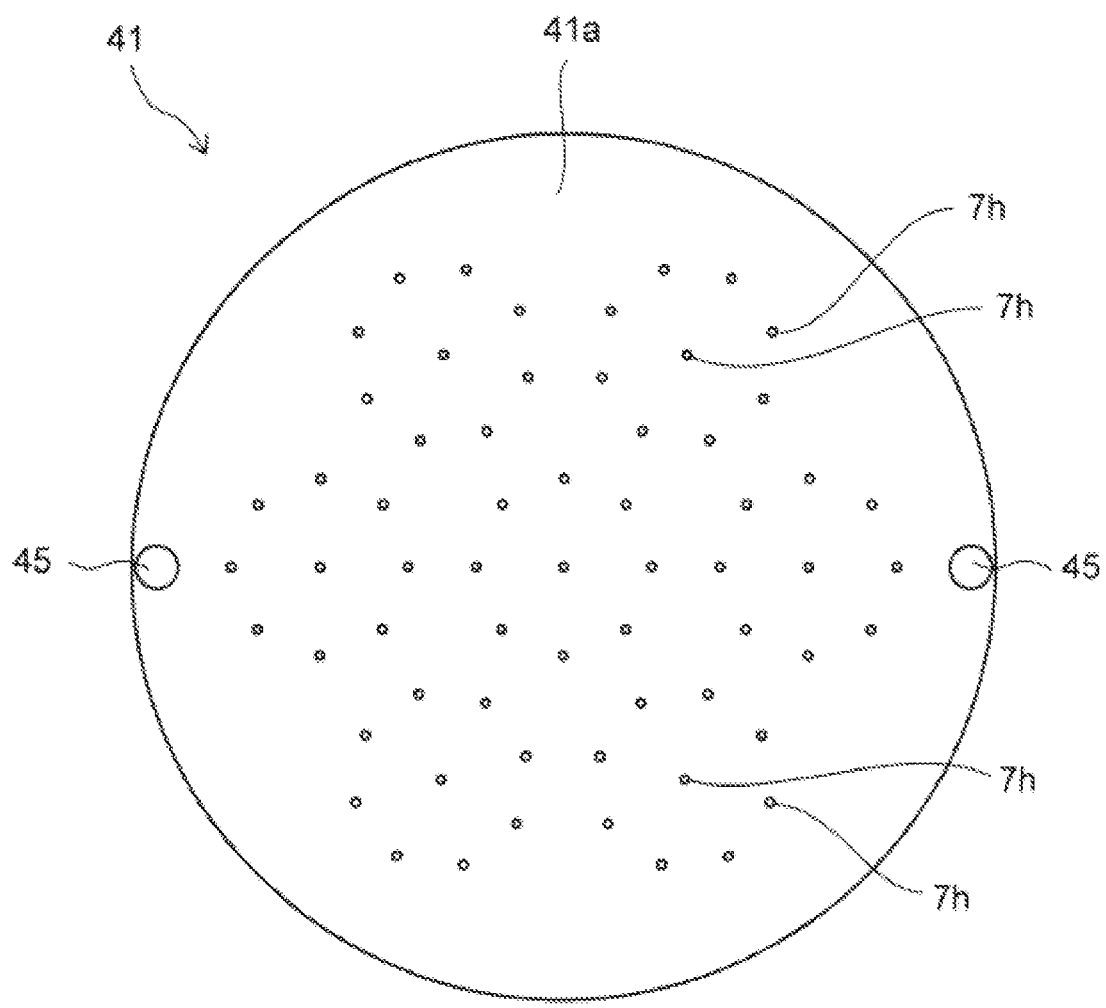
FIG. 23 is a top view of the lower plate in accordance with the third exemplary embodiment.

FIG. 23 is a top view of the lower plate 41.

As shown in FIG. 23, the lower plate 41 is substantially circular, and pins 45 that are used for position adjustment with the upper plate 42 are provided to stand at edge portions of the lower plate.

Also, the plurality of third gas holes 7h for supplying the helium gas C for cooling to the backside of the substrate S is exposed to the upper surface 41a of the lower plate 41.

Figure 24:
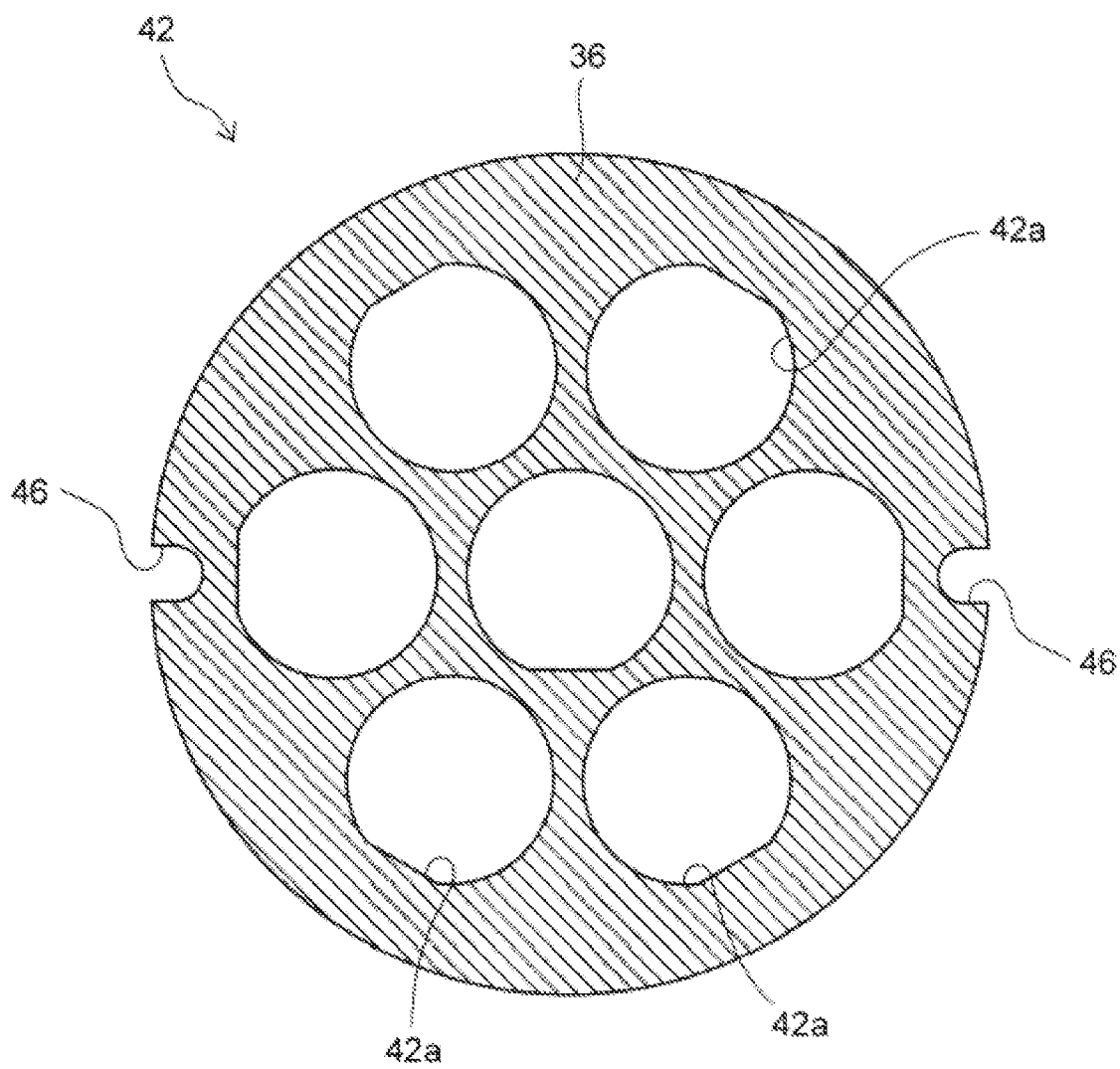
FIG. 24 is a top view of the upper plate in accordance with the third exemplary embodiment.

FIG. 24 is a top view of the upper plate 42.

As shown in FIG. 24, like the lower plate 41, the upper plate 42 is also substantially circular and is provided at its edge portions with notched portions 46.

Figure 25:
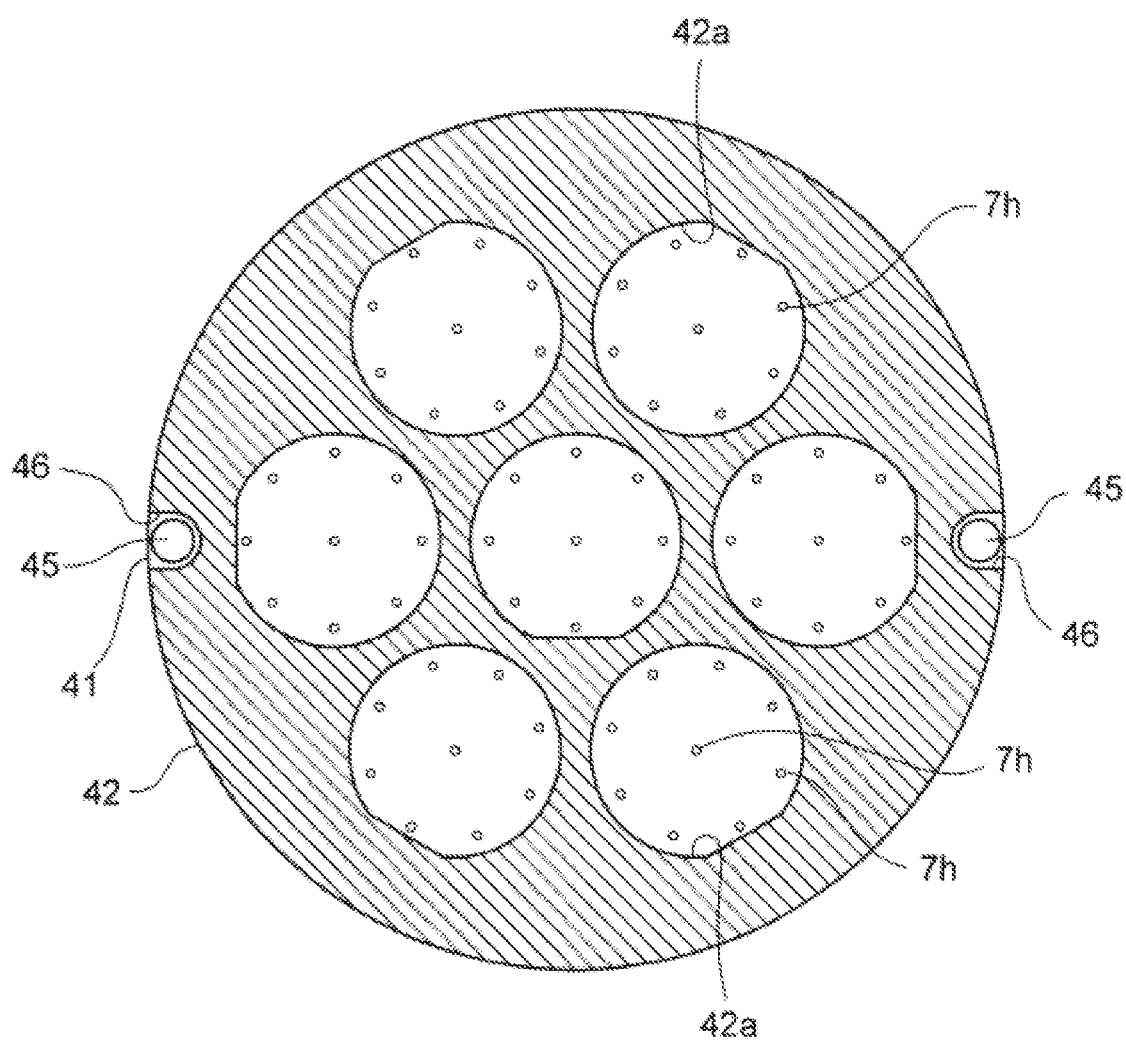
FIG. 25 is a top view when the upper plate is mounted to the lower plate, in the third exemplary embodiment.

FIG. 25 is a top view when the upper plate 42 is mounted to the lower plate 41.

As shown in FIG. 25, in the third exemplary embodiment, the pins 45 are fitted to the notched portions 46, so that the lower plate 41 and the upper plate 42 are position-adjusted. Thereby, the third gas holes 7h of the lower plate 41 are not covered with the upper plate 42, and the third gas holes 7h can be exposed to the openings 42a.

Fourth Exemplary Embodiment

In the first to third exemplary embodiments, the number of substrates S that can be conveyed by the tray 7 is seven. However, the number of substrates S is not limited thereto.

Figure 26:
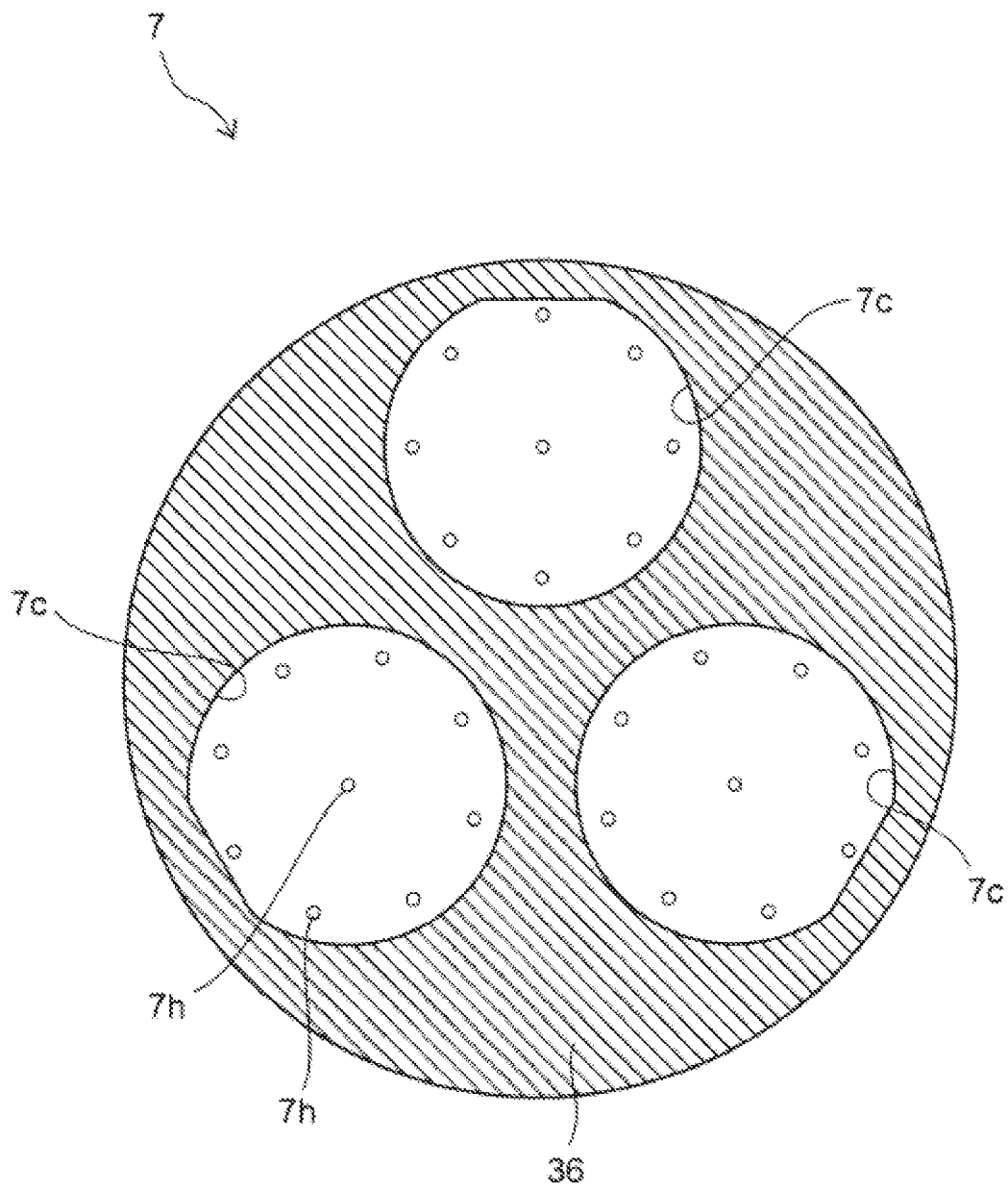
FIG. 26 is a top view of a tray in accordance with a fourth exemplary embodiment.

FIG. 26 is a top view of the tray 7 in accordance with a fourth exemplary embodiment.

In FIG. 26, the same elements as the first to third exemplary embodiments are denoted with the same reference numerals as the first to third exemplary embodiments, and the descriptions thereof are omitted.

The tray 7 of the fourth exemplary embodiment is a substantially circular shape having a diameter of about 12 inches, as seen from above, and is configured to accommodate the three substrates S having a diameter of 6 inches.

Like the first to third exemplary embodiments, the yttrium oxide layer 36 is formed on the surface of the tray 7, so that the tray 7 is protected from the etching atmosphere.

What is claimed is:

1. A substrate fixture comprising:
   a monopolar chuck main body comprising an insulated plate and an electrode embedded in the insulated plate;
   a tray placed on the monopolar chuck main body, having an upper surface in which a plurality of concave parts for accommodating therein a plurality of substrates is formed, and formed of an insulator having a volume resistivity equal to or lower than a volume resistivity of the insulated plate; and
   an yttrium oxide layer formed on the upper surface of the tray.

2. The substrate fixture according to claim 1, wherein the concave part of the tray is formed with a through-hole through which a cooling gas to be supplied to a backside of the substrate is to pass.

3. The substrate fixture according to claim 2, wherein a plurality of the through-holes is provided and a lower surface of the tray is formed with a groove configured to couple the plurality of through-holes.

4. The substrate fixture according to claim 1, wherein the comprises:
   a lower plate; and
   an upper plate configured to be detachably mounted to an upper surface of the lower plate and having openings corresponding to the plurality of concave parts, and
   wherein each of the plurality of concave parts is demarcated by the plurality of openings of the upper plate and the upper surface of the lower plate.

5. The substrate fixture according to claim 1, wherein the tray is formed of only the insulator.

6. A substrate fixing device comprising:
   a conductive base plate;
   a monopolar chuck main body comprising an insulated plate fixed on the base plate and an electrode embedded in the insulated plate;
   a tray placed on the chuck main body, having an upper surface in which a plurality of concave parts for accommodating therein a plurality of substrates is formed, and formed of an insulator having a volume resistivity equal to or lower than a volume resistivity of the insulated plate; and
   an yttrium oxide layer formed on the upper surface of the tray.

* * * * *